US009508771B2

United States Patent
Lee et al.

(10) Patent No.: US 9,508,771 B2
(45) Date of Patent: Nov. 29, 2016

(54) COMPLEMENTARY METAL-OXIDE-SEMICONDUCTOR IMAGE SENSORS

(71) Applicant: SAMSUNG ELECTRONICS CO., LTD., Suwon-si (KR)

(72) Inventors: Seungwook Lee, Yongin-si (KR); Jungchak Ahn, Yongin-si (KR); Youngwoo Jung, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/830,181

(22) Filed: Aug. 19, 2015

(65) Prior Publication Data

US 2016/0056198 A1 Feb. 25, 2016

(30) Foreign Application Priority Data

Aug. 19, 2014 (KR) ........................ 10-2014-0107842

(51) Int. Cl.
*H01L 27/146* (2006.01)

(52) U.S. Cl.
CPC ..... *H01L 27/14636* (2013.01); *H01L 27/1463* (2013.01); *H01L 27/1464* (2013.01); *H01L 27/14603* (2013.01); *H01L 27/14612* (2013.01); *H01L 27/14614* (2013.01); *H01L 27/14641* (2013.01); *H01L 27/14645* (2013.01); *H01L 27/14689* (2013.01)

(58) Field of Classification Search
CPC .................... H01L 27/14612; H01L 27/1463; H01L 27/14636; H01L 27/14603; H01L 27/14689; H01L 27/1464; H01L 27/14641; H01L 27/14645; H01L 27/14614

USPC ......................................................... 257/225
See application file for complete search history.

(56) References Cited

U.S. PATENT DOCUMENTS

| | | | |
|---|---|---|---|
| 7,459,668 B2 | 12/2008 | Mauritzson | |
| 8,390,089 B2 | 3/2013 | Chen et al. | |
| 8,415,727 B2 | 4/2013 | Manabe | |
| 2006/0180885 A1 | 8/2006 | Rhodes | |
| 2007/0141801 A1* | 6/2007 | Kwon ................. | H01L 27/1463 438/400 |
| 2007/0246788 A1 | 10/2007 | Mauritzson et al. | |
| 2008/0036024 A1* | 2/2008 | Hwang ............. | H01L 27/14627 257/432 |
| 2008/0217718 A1 | 9/2008 | Mauritzson | |
| 2011/0180689 A1 | 7/2011 | Roy et al. | |
| 2011/0284982 A1 | 11/2011 | Manabe | |

(Continued)

FOREIGN PATENT DOCUMENTS

| | | |
|---|---|---|
| EP | 1691418 B1 | 11/2008 |
| EP | 2109143 B1 | 5/2013 |

(Continued)

*Primary Examiner* — Yasser A Abdelaziez
(74) *Attorney, Agent, or Firm* — Sughrue Mion, PLLC

(57) ABSTRACT

A complementary metal-oxide-semiconductor (CMOS) image sensor is provided. The CMOS image sensor may include an epitaxial layer having a first conductivity type and having first and second surfaces, a first device isolation layer extending from the first surface to the second surface to define first and second pixel regions, a well impurity layer of a second conductivity type formed adjacent to the first surface and formed in the epitaxial layer of each of the first and second pixel regions, and a second device isolation layer formed in the well impurity layer in each of the first and second pixel regions to define first and second active portions spaced apart from each other in each of the first and second pixel regions.

20 Claims, 36 Drawing Sheets

(56) References Cited

U.S. PATENT DOCUMENTS

| | | | |
|---|---|---|---|
| 2012/0025199 A1* | 2/2012 | Chen | H01L 27/1464 257/75 |
| 2012/0077301 A1* | 3/2012 | Ahn | H01L 27/14689 438/73 |
| 2013/0221410 A1 | 8/2013 | Ahn | |
| 2013/0248954 A1 | 9/2013 | Ahn | |
| 2013/0264467 A1* | 10/2013 | Hong | H01L 27/14609 250/208.1 |
| 2014/0327052 A1 | 11/2014 | Tatani et al. | |

FOREIGN PATENT DOCUMENTS

| | | |
|---|---|---|
| JP | 2010-092988 A | 4/2010 |
| JP | 2011-155072 A | 8/2011 |
| JP | 2011-192669 A | 9/2011 |
| JP | 2013-055252 A | 3/2013 |
| KR | 10-2013-0106978 A | 3/2001 |
| KR | 10-2009-0005169 A | 1/2009 |
| KR | 10-2009-0130286 A | 12/2009 |
| KR | 10-2013-0097836 A | 9/2013 |

\* cited by examiner

2000

COMPLEMENTARY METAL-OXIDE-SEMICONDUCTOR IMAGE SENSORS

CROSS-REFERENCE TO RELATED APPLICATIONS

This U.S. non-provisional patent application claims priority under 35 U.S.C. §119 to Korean Patent Application No. 10-2014-0107842, filed on Aug. 19, 2014, in the Korean Intellectual Property Office, the entire contents of which are hereby incorporated by reference.

BACKGROUND

Exemplary embodiments of the inventive concept relate to a complementary metal-oxide-semiconductor (CMOS) image sensor, and in particular, to CMOS image sensors with improved optical characteristics.

An image sensor is a device that converts optical images into electrical signals. With increased development of the computer and communications industries, there is an increased demand for high performance image sensors in a variety of applications such as digital cameras, camcorders, personal communication systems, gaming machines, security cameras, micro-cameras for medical applications, and/or robots.

The image sensors may be generally classified into charge coupled device (CCD) and complementary metal-oxide semiconductor (CMOS) image sensors. The CMOS image sensors are operated using a simple operation method and are configured to have signal processing circuits integrated on a single chip, and thus, CMOS image sensors make it possible to realize products including scaled CMOS image sensors. In addition, CMOS image sensors may operate with relatively low consumption power, and thus, they are applicable to portable electronic devices. Furthermore, CMOS image sensors can be fabricated using cost-effective CMOS fabrication techniques and can provide high resolution images. Accordingly, the use of CMOS image sensors has increased.

SUMMARY

Exemplary embodiments of the inventive concept provide CMOS image sensors with improved optical characteristics.

According to an aspect of an exemplary embodiment, there is provided a complementary metal-oxide-semiconductor (CMOS) image sensor that may include an epitaxial layer having a first conductivity type and having a first surface and a second surface facing each other; a first device isolation layer extending from the first surface to the second surface of the epitaxial layer to define a first pixel region and a second pixel region; a well impurity layer of a second conductivity type formed adjacent to the first surface and formed in the epitaxial layer of each of the first and second pixel regions; a second device isolation layer formed in the well impurity layer in each of the first and second pixel regions to define a first active portion and a second active portion which are spaced apart from each other in each of the first and second pixel regions; first and second transfer gates disposed on the first active portions of the first and second pixel regions, respectively; first and second floating diffusion regions formed in the first active portions and beside the first and second transfer gates, respectively; and a connection line crossing over the first and second pixel regions and being connected to both the first and second floating diffusion regions.

In some exemplary embodiments, in the epitaxial layer, a doping concentration of impurities of the first conductivity type may decrease in a direction from the first surface toward the second surface.

In some exemplary embodiments, the epitaxial layer may comprise a first epitaxial layer having a first doping concentration, a second epitaxial layer having a second doping concentration different from the first doping concentration, and a third epitaxial layer having a third doping concentration different from the second doping concentration.

In some exemplary embodiments, the first epitaxial layer may be adjacent to the second surface, the third epitaxial layer may be adjacent to the first surface, and the second epitaxial layer may be disposed between the first and third epitaxial layers, and the first doping concentration may be lower than the second doping concentration, and the second doping concentration may be lower than the third doping concentration.

In some exemplary embodiments, the CMOS image sensor may comprise a potential barrier layer having the second conductivity type and enclosing a sidewall of the first device isolation layer, and a doping concentration of impurities of the second conductivity type may be higher in the potential barrier layer than in the well impurity layer.

In some exemplary embodiments, the first device isolation layer may comprise an insulating layer extending from the first surface to the second surface of the epitaxial layer, and the epitaxial layer may be in direct contact with the insulating layer.

In some exemplary embodiments, a width of the first device isolation layer may decrease in a direction from the first surface toward the second surface.

In some exemplary embodiments, a width of the first device isolation layer may increase in a direction from the first surface toward the second surface.

In some exemplary embodiments, the first device isolation layer may comprise an insulating layer extending from a bottom surface of the second device isolation layer to the second surface of the epitaxial layer, the insulating layer having an air gap formed therein.

In some exemplary embodiments, the first device isolation layer may comprise a first insulating layer being in contact with the epitaxial layer and having a refractive index lower than that of the epitaxial layer; and a second insulating layer having a refractive index different from that of the first insulating layer.

In some exemplary embodiments, the CMOS image sensor may further comprise a first logic transistor formed on the second active portion of the first pixel region; and a second logic transistor formed on the second active portion of the second pixel region, and the connection line may electrically connected to a drain electrode of the first logic transistor and a gate electrode of the second logic transistor.

In some exemplary embodiments, the CMOS image sensor may further comprise a third logic transistor formed on the second active portion of the second pixel region, and the third logic transistor may be connected in series to the second logic transistor.

According to another aspect of an exemplary embodiment, there is provided a complementary metal-oxide-semiconductor (CMOS) image sensor, comprising an epitaxial layer having a first conductivity type and having a first surface and a second surface facing each other; a first device isolation layer extending from the first surface to the second surface of the epitaxial layer to define a pixel region in the epitaxial layer; a well impurity layer formed adjacent to the first surface and formed in the pixel region of the epitaxial layer, the well impurity layer having a second conductivity type; a second device isolation layer formed adjacent to the first surface and formed in the well impurity layer to define a first active portion and a second active portion spaced apart from each other; a charge transfer gate provided on the well impurity layer of the first active portion; a floating diffusion region formed in the first active portion and beside the charge transfer gate; and a logic transistor formed on the well impurity layer of the second active portion.

In some exemplary embodiments, the epitaxial layer may comprise a first epitaxial layer having a first doping concentration, a second epitaxial layer having a second doping concentration different from the first doping concentration, and a third epitaxial layer having a third doping concentration different from the second doping concentration.

In some exemplary embodiments, the first epitaxial layer may be adjacent to the second surface, the third epitaxial layer may be adjacent to the first surface, and the second epitaxial layer may be disposed between the first and third epitaxial layers, and the first doping concentration may be lower than the second doping concentration, and the second doping concentration may be lower than the third doping concentration.

In some exemplary embodiments, the first device isolation layer may comprises an insulating layer extending from a bottom surface of the second device isolation layer to the second surface of the epitaxial layer, and the epitaxial layer may be in direct contact with the device isolation layer.

In some exemplary embodiments, the CMOS image sensor may further comprise a potential barrier layer having the second conductivity type and enclosing a sidewall of the first device isolation layer, and a doping concentration of impurities of the second conductivity type may be higher in the potential barrier layer than in the well impurity layer.

In some exemplary embodiments, the first device isolation layer may comprise an insulating layer extending from a bottom surface of the second device isolation layer to the second surface of the epitaxial layer, and a width of the insulating layer may increase in a direction from the first surface toward the second surface.

In some exemplary embodiments, the charge transfer gate may have a bottom surface positioned at a lower level than that of a bottom surface of a gate electrode of the logic transistor.

In some exemplary embodiments, the CMOS image sensor may further comprise a connection line electrically connecting the floating diffusion region to the logic transistor.

According to another aspect of an exemplary embodiment, there is provided a complementary metal-oxide-semiconductor (CMOS) image sensor, comprising an epitaxial layer having a first conductivity; a first device isolation layer formed in the epitaxial layer and isolating a first pixel region from a second pixel region; a well impurity layer formed in the epitaxial layer of each of the first and second pixel regions, the well impurity layer having a second conductivity; a second device isolation layer formed in the well impurity layer in each of the first and second pixel regions to isolate, in each of the first and second pixel regions, a first active portion from a second active portion, wherein transfer gates are disposed on the first active portions and floating diffusion regions are formed in the active portions to generate and collect photocharges in the first and second pixel regions.

In some exemplary embodiments, an area of the first pixel region and an area of the second pixel region of the epitaxial layer available to generate the photocharges may be larger than areas used to generate photocharges in a CMOS sensor formed using ion implantation.

In some exemplary embodiments, substantially a whole area of the first pixel region and substantially a whole area of the second pixel region may be used to generate the photocharges.

In some exemplary embodiments, the epitaxial layer may comprise a first epitaxial layer having a first doping concentration, a second epitaxial layer having a second doping concentration different from the first doping concentration, and a third epitaxial layer having a third doping concentration different from the second doping concentration.

In some exemplary embodiments, the first doping concentration may be lower than the second doping concentration, and the second doping concentration may be lower than the third doping concentration, and the third epitaxial layer may be adjacent to the well impurity layer.

In some exemplary embodiments, the CMOS image sensor may further comprise a potential barrier layer having the second conductivity and enclosing a sidewall of the first device isolation layer, and a doping concentration of impurities of the second conductivity may be higher in the potential barrier layer than in the well impurity layer.

In some exemplary embodiments, the first device isolation layer may comprise an insulating layer, and the epitaxial layer may be in direct contact with the insulating layer.

In some exemplary embodiments, a width of the first device isolation layer may be non-uniform within the epitaxial layer.

BRIEF DESCRIPTION OF THE DRAWINGS

Exemplary embodiments will be more clearly understood from the following brief description taken in conjunction with the accompanying drawings. The accompanying drawings represent non-limiting, exemplary embodiments as described herein.

Figure 1:
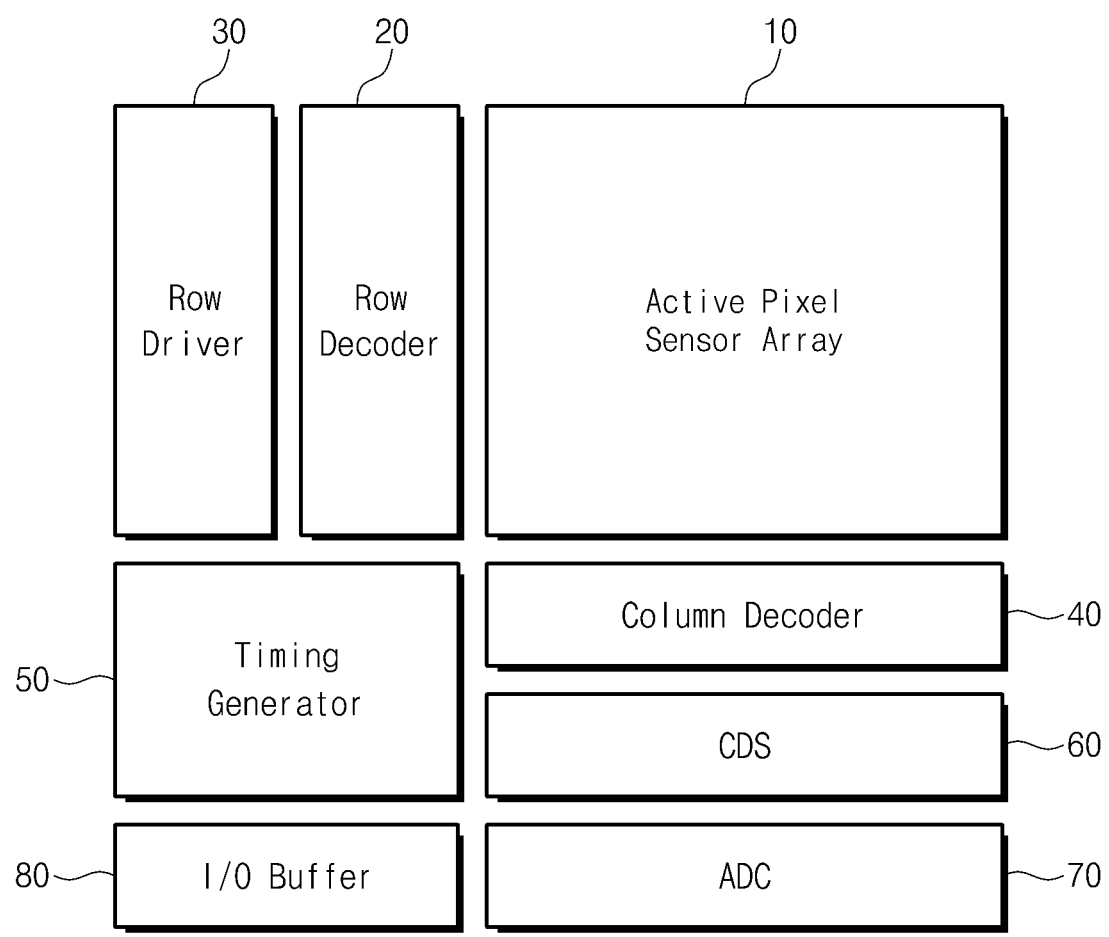
FIG. 1 is a block diagram of a CMOS image sensor according to exemplary embodiments of the inventive concept.

It should be noted that these figures are intended to illustrate the general characteristics of methods, structure and/or materials utilized in certain exemplary embodiments and to supplement the written description provided below. These drawings are not, however, to scale and may not precisely reflect the precise structural or performance characteristics of any given exemplary embodiment, and should not be interpreted as defining or limiting the range of values or properties encompassed by the exemplary embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Exemplary embodiments of the inventive concepts will now be described more fully with reference to the accompanying drawings, in which exemplary embodiments are shown. Exemplary embodiments of the inventive concepts may, however, be embodied in many different forms and should not be construed as being limited to the exemplary embodiments set forth herein; rather, these exemplary embodiments are provided so that this disclosure will be thorough and complete, and will fully convey the concept of the exemplary embodiments to those of ordinary skill in the art. In the drawings, the thicknesses of layers and regions are exaggerated for clarity. Like reference numerals in the drawings denote like elements, and thus their repeated description after their first introduction and discussion will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a "first" element, component, region, layer or section discussed below could be termed a "second" element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Exemplary embodiments of the inventive concepts are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments.

As appreciated by the present inventive entity, devices and methods of forming devices according to various exemplary embodiments described herein may be embodied in microelectronic devices such as integrated circuits, wherein a plurality of devices according to various exemplary embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various exemplary embodiments described herein may include a plurality of the devices in an array and/or in a two-dimensional pattern that is based on the functionality of the microelectronic device.

The devices according to various exemplary embodiments described herein may be interspersed among other devices depending on the functionality of the microelectronic device. Moreover, microelectronic devices according to various exemplary embodiments described herein may be replicated in a third direction that may be orthogonal to the two different directions, to provide three-dimensional integrated circuits.

Accordingly, the cross-sectional view(s) illustrated herein provide support for a plurality of devices according to various exemplary embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which exemplary embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram of a CMOS image sensor according to exemplary embodiments of the inventive concept.

Referring to FIG. 1, a CMOS image sensor may include an active pixel sensor array 10, a row decoder 20, a row driver 30, a column decoder 40, a timing generator 50, a correlated double sampler (CDS) 60, an analog-to-digital converter (ADC) 70, and an I/O buffer 80.

The active pixel sensor array 10 may include a plurality of unit pixels that are arranged two-dimensionally to convert optical signals to electrical signals. The active pixel sensor array 10 may be driven by a plurality of driving signals, such as a pixel selection signal, a reset signal, and a charge transmission signal, which are transmitted from the row driver 30. The converted electrical signal may be provided to the CDS 60.

The row driver 30 may provide several driving signals for driving several unit pixels to the active pixel sensor array 10 in accordance with the decoded result obtained from the row decoder 20. In the case where the unit pixels are arranged in a matrix shape, the driving signals may be supplied to the respective rows.

The timing generator 50 may provide timing and control signals to the row decoder 20 and the column decoder 40.

The CDS 60 may receive the electric signals generated in the active pixel sensor array 10, and may hold and sample the received electric signals. The CDS 60 may perform a double sampling operation on a specific noise level and a signal level of the electric signal to output a difference level corresponding to a difference between the noise and signal levels.

The ADC 70 may convert analog signals corresponding to the difference level output from the CDS 60 into digital signals, and then output the converted digital signals.

The I/O buffer 80 may latch the digital signal and then output the latched digital signals sequentially to an image signal processor (not shown) in accordance with the decoding result obtained from the column decoder 40.

Figure 2A:
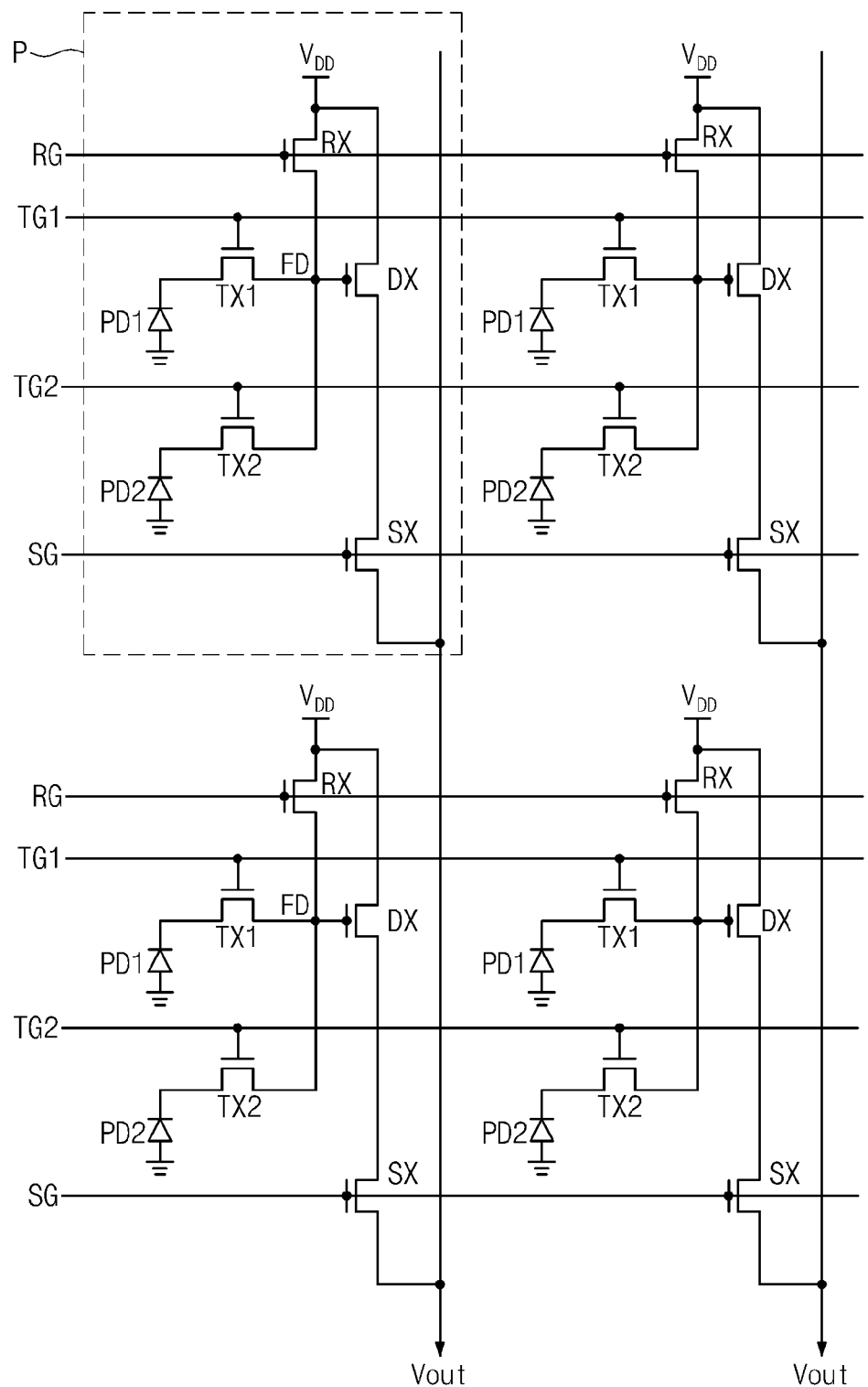
FIGS. 2A and 2B are circuit diagrams of active pixel sensor arrays of CMOS image sensors according to exemplary embodiments of the inventive concept.
Figure 2B:
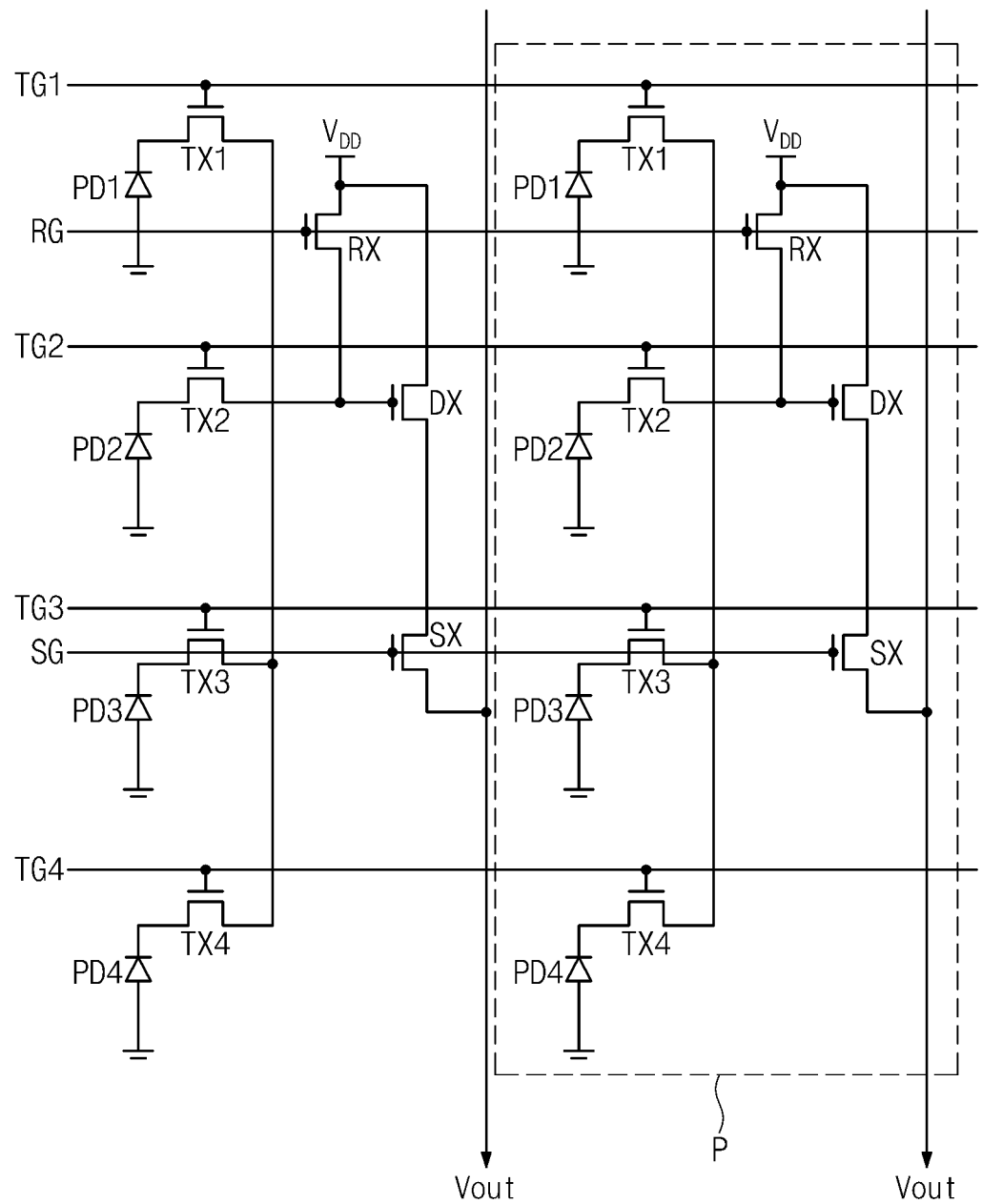

FIGS. 2A and 2B are circuit diagrams of active pixel sensor arrays of CMOS image sensors according to exemplary embodiments of the inventive concept.

Referring to FIG. 2A, the active pixel sensor array 10 according to an exemplary embodiment may include a plurality of unit pixels P, which are arranged in a matrix shape. In this exemplary embodiment, the unit pixel P may include a first transfer transistor TX1 and a second transfer transistor TX2, and a plurality of logic transistors RX, SX, and DX. Here, the logic transistors may include a reset transistor RX, a selection transistor SX, and a drive transistor or source follower transistor DX.

The first transfer transistor TX1 may include a first transfer gate electrically connected to signal line TG1 and a first photoelectric conversion device PD1, and the second transfer transistor TX2 may include a second transfer gate electrically connected to signal line TG2 and a second photoelectric conversion device PD2. The first and second transfer transistors TX1 and TX2 may share a charge detection node FD (e.g., a floating diffusion region).

In the first and second photoelectric conversion devices PD1 and PD2, photocharges may be generated proportional to an amount of external incident light and then be accumulated therein. Each of the first and second photoelectric conversion devices PD1 and PD2 may be provided in a form of a photo diode, a photo transistor, a photo gate, a pinned photo diode (PPD), or any combination thereof.

The first and second charge transfer gates that are electrically connected to signal lines TG1 and TG2, respectively, may control an operation of transferring charges accumulated in the first and second photoelectric conversion devices PD1 and PD2, respectively, to the charge detection node FD (e.g., the floating diffusion region). The first and second charge transfer gates that are electrically connected to signal lines TG1 and TG2, respectively, may be applied with signals being complementary to each other. In other words, the first and second charge transfer gates may be operated in such a way that the photocharges are selectively transferred from one of the first and second photoelectric conversion devices PD1 and PD2 to the charge detection node FD.

The photocharges generated in the first and second photoelectric conversion devices PD1 and PD2 may be cumulatively stored in the charge detection node FD. The drive transistor DX may be operated depending on an amount of the photocharges stored in the charge detection node FD.

The reset transistor RX may be operated according to reset signal on signal line RD to periodically discharge the photocharges stored in the charge detection node FD. For example, the reset transistor RX may be configured in such a way that a drain electrode thereof is electrically connected to the charge detection node FD and a source electrode thereof is connected to a power voltage VDD. If the reset transistor RX is turned on, the power voltage VDD may be applied to the charge detection node FD through the source electrode of the reset transistor RX, and thus, the photocharges stored in the charge detection node FD may be discharged to the power voltage VDD through the reset transistor RX. In other words, the charge detection node FD may be reset, when the reset transistor RX is turned on.

The drive transistor DX, in conjunction with an electrostatic current source (not shown) outside the unit pixel P, may serve as a source follower buffer amplifier. In other words, the drive transistor DX may be used to amplify a variation in electric potential of the charge detection node FD and output the amplified signal to an output line Vout.

The selection transistor SX may select a row of the unit pixels P to be read according to a selection signal on signal line SG. If the selection transistor SX is turned on, the power voltage VDD may be applied to a drain electrode of the selection transistor SX through the drive transistor DX.

Referring to FIG. 2B, the active pixel sensor array 10 according to another exemplary embodiment may include a plurality of the unit pixels P, each of which may include four transfer transistors TX1, TX2, TX3, and TX4. In this exemplary embodiment, the charge detection node FD and the logic transistors RX, SX, and DX may be shared by the four transfer transistors TX1, TX2, TX3, and TX4.

In this exemplary embodiment, each row of the unit pixels P to be read may be selected by a selection signal on signal line SG. Signals applied to first to fourth charge transfer gates of the four transfer transistors TX1, TX2, TX3, and TX4 that are electrically connected to signal lines TG1, TG2, TG3, and TG4, respectively, may be used to control an operation of selectively transferring photocharges from one of first to fourth photoelectric conversion devices PD1, PD2, PD3, and PD4 to the charge detection node FD.

Figure 3:
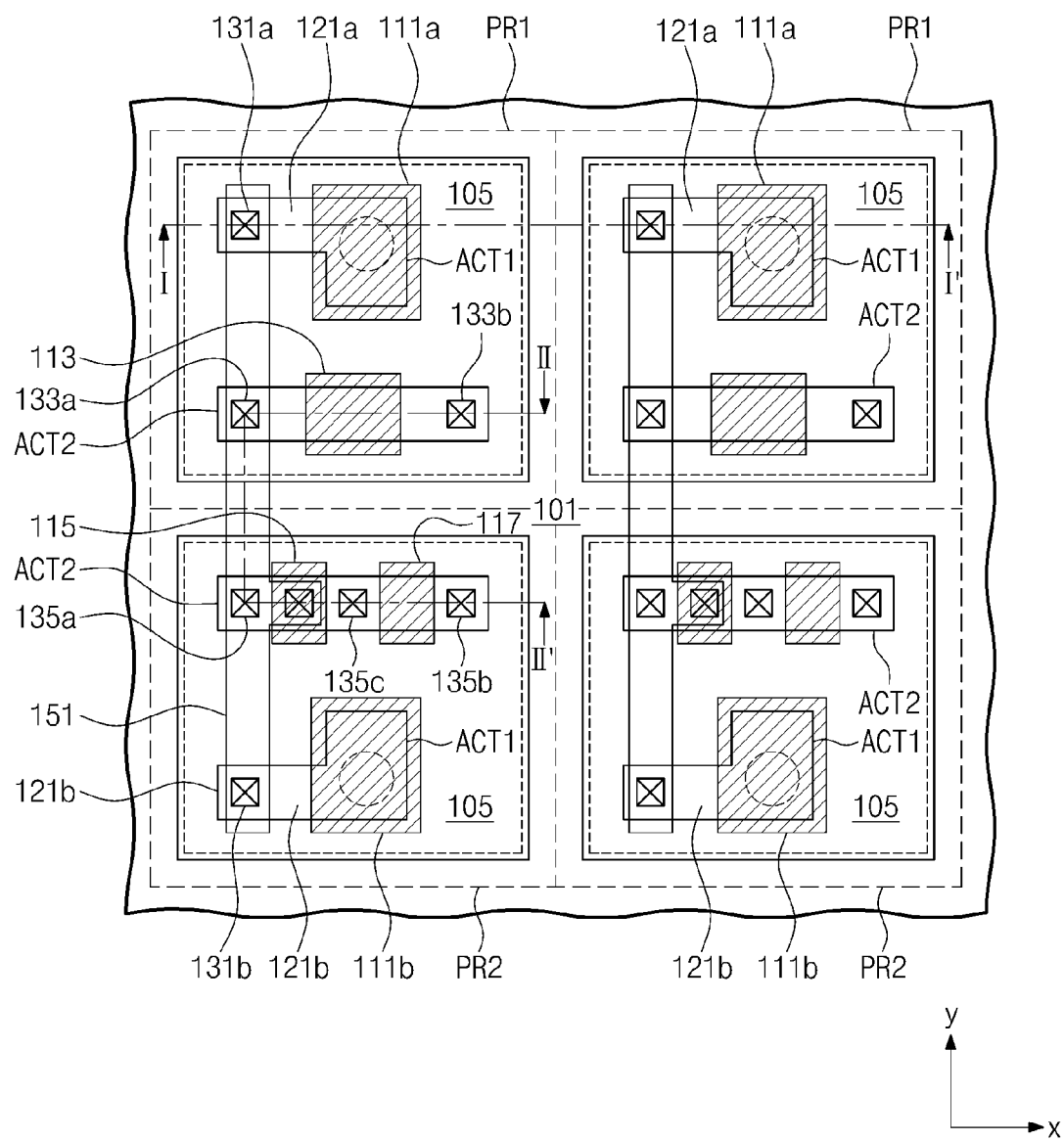
FIG. 3 is a schematic plan view of a CMOS image sensor according to exemplary embodiments of the inventive concept.
Figure 4A:
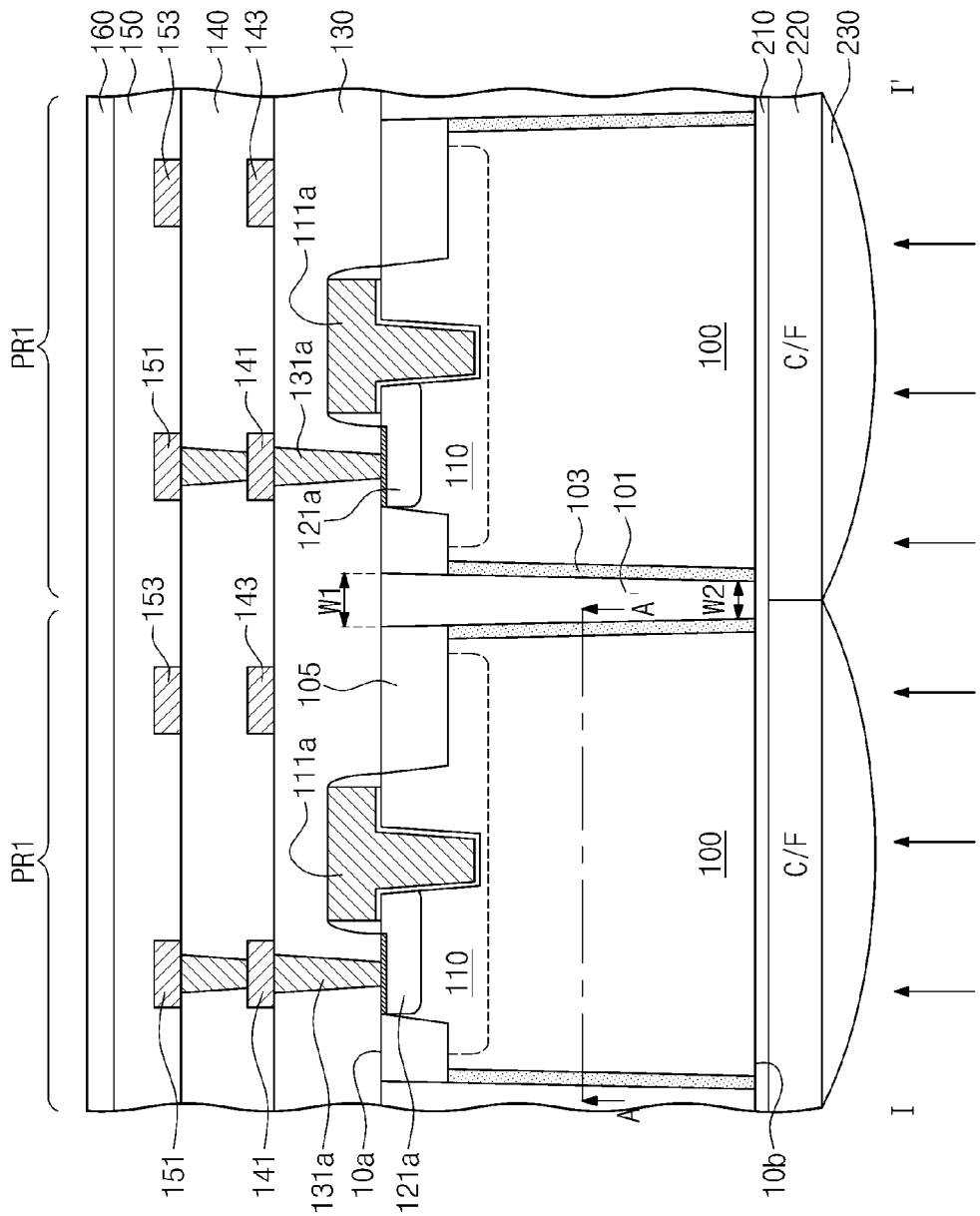
FIG. 4A is a sectional view of the CMOS image sensor of FIG. 3, taken along line I-I' of FIG. 3.
Figure 4B:
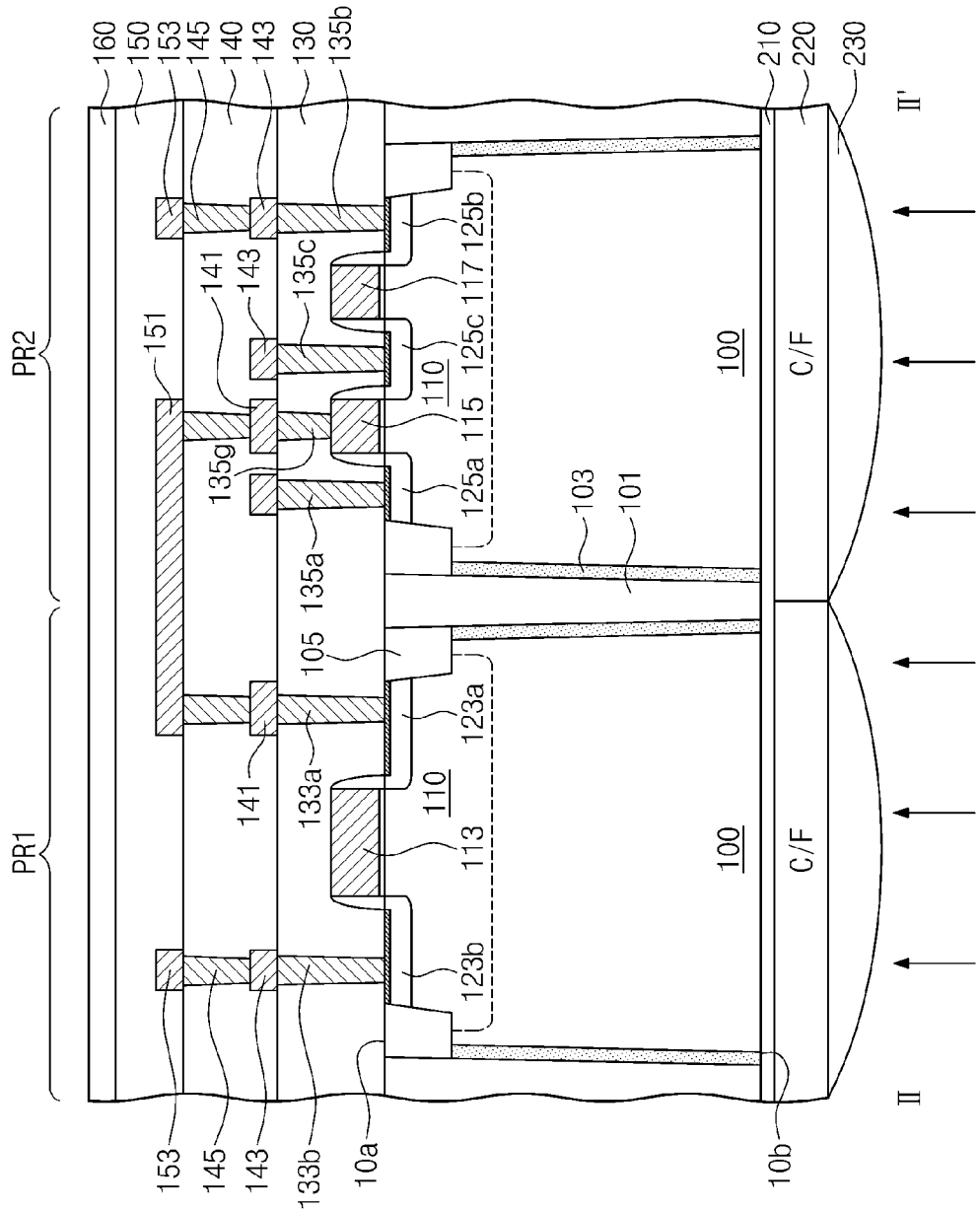
FIG. 4B is a sectional view of a CMOS image sensor of FIG. 3, taken along line II-II' of FIG. 3.

FIG. 3 is a schematic plan view of a CMOS image sensor according to exemplary embodiments of the inventive concept. FIG. 4A is a sectional view of the CMOS image sensor of FIG. 3, taken along line I-I' of FIG. 3. FIG. 4B is a sectional view of the CMOS image sensor of FIG. 3, taken along line II-II' of FIG. 3.

Referring to FIGS. 3, 4A, and 4B, an epitaxial layer 100 of a first conductivity type may have a first surface 10a and a second surface 10b facing each other. The epitaxial layer 100 may be, for example, a silicon epitaxial layer doped with n-type impurities. In the epitaxial layer 100, a doping concentration of n-type impurities may decrease in a direction from the first surface 10a toward the second surface 10b of the epitaxial layer 100.

The epitaxial layer 100 may include a first pixel region PR1 and a second pixel region PR2 defined by a first device isolation layer 101. In exemplary embodiments, the first and second pixel regions PR1 and PR2 may be alternatively arranged in a y-axis direction, the first pixel regions PR1 may be arranged adjacent to each other in an x-axis direction, and the second pixel regions PR2 may also be arranged adjacent to each other in the x-axis direction.

Each of the first and second pixel regions PR1 and PR2 may be defined by the first device isolation layer 101 formed in the epitaxial layer 100. The first device isolation layer 101 may extend from the first surface 10a of the epitaxial layer 100 to the second surface 10b in a vertical direction. For example, a vertical thickness of the first device isolation layer 101 may be substantially equal to that of the epitaxial layer 100. In exemplary embodiments, the first device isolation layer 101 may have an upper width W1, at a level adjacent to the first surface 10a of the epitaxial layer 100, and a lower width W2 smaller than the upper width W1, at a level adjacent to the second surface 10b of the epitaxial layer 100. The width of the first device isolation layer 101 may gradually decrease from the first surface 10a to the second surface 10b of the epitaxial layer 100. In addition, the first device isolation layer 101 may be formed of or include an insulating material having a refractive index smaller than that of the epitaxial layer 100. For example, the epitaxial layer 100 may be made of silicon, and the insulating material of the first device isolation layer 101 may have a refractive index smaller than that of silicon. The first device isolation layer 101 may include a plurality of insulating layers.

According to exemplary embodiments, in the epitaxial layer 100 of the first and second pixel regions PR1 and PR2, photocharge may be generated proportional to an intensity of an incident light. Further, the area of the first and second pixel regions PR1 and PR2 defined by the first device isolation layer 101 may be used for the generation of the photocharges caused by the incident light. In some exemplary embodiments, the whole area of the first and second pixel regions PR1 and PR2 may be used for the generation of the photocharges. Since the first device isolation layer 101 has a refractive index smaller than that of the epitaxial layer 100, a fraction of light being slantingly incident to the first device isolation layer 101 may be reflected by the first device isolation layer 101 and be prevented from being incident to a neighboring pixel region. Since the first device isolation layer 101 is formed to penetrate through the epitaxial layer 100, the epitaxial layer 100 of the first pixel region PR1 may be perfectly separated from the epitaxial layer 100 of the second pixel region PR2. Accordingly, it is possible to prevent the photocharges from being moved between the first and second pixel regions PR1 and PR2 through a random drift effect.

Furthermore, in exemplary embodiments, a potential barrier layer 103 may be provided on a sidewall of the first device isolation layer 101. In exemplary embodiments, the potential barrier layer 103 may have a second conductivity type, or may contain p-type impurities. The potential barrier layer 103 may be in direct contact with the epitaxial layer 100 having the first conductivity type. The potential barrier layer 103 may contribute to prevent a dark current from occurring at a surface of a deep trench, which is formed in the epitaxial layer 100, and in which the first device isolation layer 101 is provided. For example, during the formation of the deep trench, surface defects may be formed on the surface of the deep trench and may be used as sources for an electron-hole pair (EHP) generation and the consequent dark current, but according to exemplary embodiments of the inventive concept, the dark current can be prevented by the potential barrier layer 103.

A well impurity layer 110 having the second conductivity type may be provided in the epitaxial layer 100 of each of the first and second pixel regions PR1 and PR2. The well impurity layer 110 may be provided adjacent to the first surface 10a of the epitaxial layer 100 and may contain p-type impurities. When measured from the first surface 10a, a depth of the well impurity layer 110 may be smaller than that of the first device isolation layer 101. Further, a p-type doping concentration of the well impurity layer 110 may be lower than that of the potential barrier layer 103.

In exemplary embodiments, a second device isolation layer 105 may be formed in the epitaxial layer 100 and adjacent to the first surface 10a to define a first active portion ACT1 and a second active portion ACT2. The second device isolation layer 105 may be formed in the well impurity layer 110, and the first and second active portions ACT1 and ACT2 may be formed in each of the first and second pixel regions PR1 and PR2. The first and second active portions ACT1 and ACT2 may be portions of the well impurity layer 110. The first and second active portions ACT1 and ACT2 may be disposed spaced apart from each other in each of the first and second pixel regions PR1 and PR2 and may have different sizes or areas from each other. In exemplary embodiments, when viewed in plan view, in a pair of the first and second pixel regions PR1 and PR2 adjacent to each other in the y-axis direction, the second active portions ACT2 therein may be disposed adjacent to each other, as shown in FIG. 3. In other words, when viewed in plan view, in the case of the adjacent pair of the first and second pixel regions PR1 and PR2, the second active portions ACT2 thereof may be disposed between the first active portions ACT1 thereof. Furthermore, when measured from the first surface 10a of the epitaxial layer 100, a vertical depth of the second device isolation layer 105 may be smaller than that of the first device isolation layer 101. In certain embodiments, a bottom surface of the second device isolation layer 105 may be positioned in the well impurity layer 110 or spaced apart from a bottom surface of the well impurity layer 110.

A first transfer gate 111a and a first floating diffusion region 121a may be provided on and in the first active portion ACT1 of the first pixel region PR1, and a second transfer gate 111b and a second floating diffusion region 121b may be provided on and in the first active portion ACT1 of the second pixel region PR2.

When viewed in plan view, the first and second transfer gates 111a and 111b may be disposed on central portions of the first and second pixel regions PR1 and PR2, respectively. That is, as shown in FIG. 3, the first and second transfer gates 111a and 111b may be disposed on central portions of the first and second pixel regions PR1 and PR2 in the x-axis direction. Each of the first and second transfer gates 111a and 111b may include a lower portion inserted in the well impurity layer 110 and an upper portion connected to the lower portion and provided on the first surface 10a of the epitaxial layer 100. The first and second transfer gates 111a and 111b may be provided in such a way that bottom surfaces thereof are positioned at a level higher than that of the well impurity layer 110, and a gate insulating layer may be interposed between the first and second transfer gates 111a and 111b and the well impurity layer 110. The formation of the first and second transfer gates 111a and 111b may include forming trenches in the well impurity layer 110 and sequentially forming the gate insulating layer and a gate conductive layer to fill the trenches.

The first floating diffusion region 121a may be formed in a portion of the well impurity layer 110 positioned at a side of the first transfer gate 111a, and the second floating diffusion region 121b may be formed in a portion of the well impurity layer 110 positioned at a side of the second transfer gate 111b. The first and second floating diffusion regions 121a and 121b may have the first conductivity type that is different from that of the well impurity layer 110. For example, the first and second floating diffusion regions 121a and 121b may be formed by injecting n-type impurities into the well impurity layer 110.

The logic transistors may be formed on the second active portions ACT2 of the first and second pixel regions PR1 and PR2. For example, the reset transistor RX (e.g., of FIG. 2A) may be formed on the second active portion ACT2 of the first pixel region PR1, and the source follower transistor DX (e.g., of FIG. 2A) and the selection transistor SX (e.g., of FIG. 2A) may be formed on the second active portion ACT2 of the second pixel region PR2. The first and second pixel regions PR1 and PR2 may share the logic transistors.

In exemplary embodiments, a reset gate 113 may be provided on the second active portion ACT2 of the first pixel region PR1, and a source follower gate 115 and a selection gate 117 may be provided on the second active portion ACT2 of the second pixel region PR2. The gate insulating layer may be provided between the reset, source follower, and selection gates 113, 115, and 117 and the well impurity layer 110.

A first impurity region 123a may be formed in a portion of the well impurity layer 110 positioned at a side of the reset gate 113, and a second impurity region 123b may be formed in another portion of the well impurity layer 110 positioned at other side of the reset gate 113. A third impurity region 125a may be formed in a portion of the well impurity layer 110 positioned at a side of the source follower gate 115, and a fourth impurity region 125b may be formed in another portion of the well impurity layer 110 positioned at other side of the selection gate 117. Further, a common impurity region 125c may be formed in the well impurity layer 110 between the source follower gate 115 and the selection gate 117.

The first to fourth impurity regions 123a, 123b, 125a, and 125b and the common impurity region 125c may be formed using an ion implantation process to have a different conductivity type from that of the well impurity layer 110. For example, the first to fourth impurity regions 123a, 123b, 125a, and 125b and the common impurity region 125c may be n-type impurity regions.

In exemplary embodiments, an interconnection structure may be provided on the first surface 10a of the epitaxial layer 100, and the interconnection structure may include interconnection lines 141, 143, 151, and 153 and contact plugs 131a, 131b, 133a, 133b, 135a, 135b, and 135c, which may be connected to the logic transistors. For example, interlayered insulating layers 130, 140, and 150 and a passivation layer 160 may be provided on the first surface 10a of the epitaxial layer 100. Here, the interlayered insulating layers 130, 140, and 150 may be formed to cover the first and second transfer gates 111a and 111b and the reset, source follower, and selection gates 113, 115, and 117. A plurality of the contact plugs 131a, 131b, 133a, 133b, 135a, 135b, and 135c and a plurality of the interconnection lines 141, 143, 151, and 153 may be provided in the interlayered insulating layers 130, 140, and 150.

The first FD contact plug 131a and the second FD contact plug 131b may be coupled to the first floating diffusion region 121a and the second floating diffusion region 121b, respectively. The first contact plug 133a may be coupled to the first impurity region 123a, and the second contact plug 133b may be coupled to the second impurity region 123b. The third contact plug 135a may be coupled to the third impurity region 125a, and the fourth contact plug 135b may be coupled to the fourth impurity region 125b. The common contact plug 135c may be coupled to the common impurity region 125c. Further, in certain exemplary embodiments, a gate contact plug 135g may be coupled to the source follower gate 115.

In exemplary embodiments, each of the contact plugs 131a, 131b, 133a, 133b, 135a, 135b, 135c, and 135g may include a barrier metal layer and a metal layer. The barrier metal layer may be formed of or include one of metal nitrides (e.g., titanium nitride, tantalum nitride, tungsten nitride, hafnium nitride, and zirconium nitride). The metal layer may be formed of or include at least one of tungsten, copper, hafnium, zirconium, titanium, tantalum, aluminum, ruthenium, palladium, platinum, cobalt, nickel, or conductive metal nitrides. Furthermore, in certain exemplary embodiments, a silicide layer may be formed between the contact plugs 131a, 131b, 133a, 133b, 135a, 135b, 135c, and 135g and the impurity regions 121a, 121b, 123a, 123b, 125a, 125b, and 125c.

In exemplary embodiments, the first and second floating diffusion regions 121a and 121b may be electrically connected to each other by the connection line 151. For example, the connection line 151 may be formed to cross over a boundary between the first and second pixel regions PR1 and PR2 and may be electrically connected in common to the first and second floating diffusion regions 121a and 121b through the first and second FD contact plugs 131a and 131b, respectively. The connection line 151 may be electrically connected to the first impurity region 123a through the first contact plug 133a and may be electrically connected to the source follower gate 115 through the gate contact plug 135g.

The second and third contact plugs 133b and 135a may be connected to a power line, to which a power voltage is applied, and the fourth contact plug 135b may be connected to an output line for outputting optical signals generated in each pixel. The interconnection lines 141, 143, 151, and 153 (such as the connection line, the power line, and the output line) may be formed of or include at least one of copper (Cu), aluminum (Al), tungsten (W), titanium (Ti), molybdenum (Mo), tantalum (Ta), titanium nitride layer (TiN), tantalum nitride layer (TaN), zirconium nitride layer (ZrN), tungsten nitride layer (WN), or alloys thereof.

A color filter (C/F) layer 220 and micro lenses 230 may be provided on the second surface 10b of the epitaxial layer 100. A protective planarization layer 210 may be provided between the second surface 10b of the epitaxial layer 100 and the color filter layer 220.

The protective planarization layer 210 may be a highly-doped impurity layer doped with p-type impurities (e.g., boron (B)). In the case where there are dangling bonds on a surface of a silicon layer or surface defects or interface traps formed by an etching stress, the second surface 10b of the epitaxial layer 100 may have a lowered electric potential, and thus, a depletion well may be formed adjacent to the second surface 10b in the epitaxial layer 100. However, according to exemplary embodiments of the inventive concept, due to the presence of the protective planarization layer 210, it is possible to prevent the second surface 10b of the epitaxial layer 100 from having the lowered electric potential and/or to prevent the depletion well from being formed in the epitaxial layer 100. The protective planarization layer 210 makes it possible to form an electric potential gradient, allowing photocharges to flow into the first and second floating diffusion region 121a and 121b, when the photocharges are generated in a portion adjacent to the second surface 10b of the epitaxial layer 100.

The color filter layer 220 and each of the micro lenses 230 may be formed to face each of the first and second pixel regions PR1 and PR2. The color filter layer 220 may include one of red, green, or blue filters, depending on a color of each unit pixel. The color filters may be two-dimensionally arranged. In certain exemplary embodiments, the color filter layer 220 may include yellow, magenta, and cyan filters. Further, the color filter layer 220 may further include a white filter.

The micro lens 230 may have an upwardly-convex shape and may have a specific curvature radius. Each of the micro lenses 230 may be formed of an optically transparent resin to focus incident light on a corresponding one of the first and second pixel regions PR1 and PR2.

Figure 5:
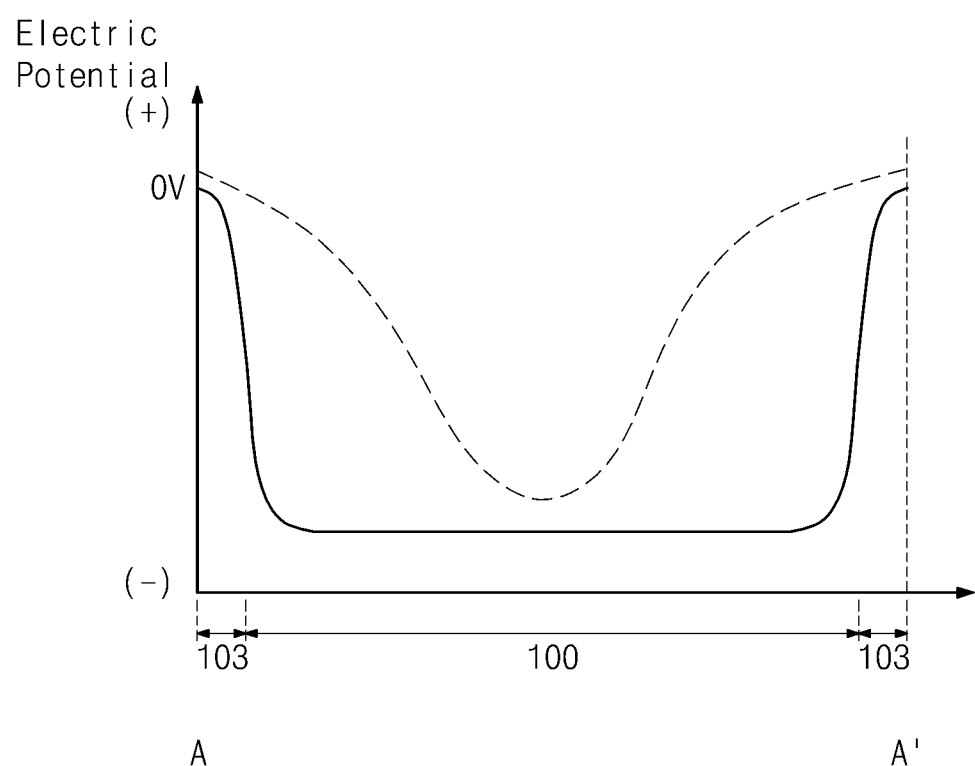
FIG. 5 is a graph showing an electric potential in a region of the CMOS image sensor of FIG. 4A, taken along line A-A' of FIG. 4A.

FIG. 5 is a graph showing an electric potential in a region of a CMOS image sensor according to exemplary embodiments of the inventive concept, taken along line A-A' of FIG. 4A. In FIG. 5, in the case where an n-type impurity region is formed in a p-type epitaxial layer of a photodiode by using an ion implantation process, the p-type epitaxial layer has an electric potential shown by a dotted line. By contrast, in the case where an epitaxial growth process is performed in an in-situ doping manner in an epitaxial growth process and thereby an n-type epitaxial layer of the whole pixel region is used as a photoelectric conversion device, the n-type epitaxial layer has an electric potential shown by a solid line.

Referring to FIG. 5, in the case where a photodiode is formed in a pixel region using an ion implantation process, there may be a difference in doping concentration between center and edge portions of the pixel region, and this may lead to a large difference in electric potential between the center and edge portions of the pixel region. Accordingly, only a portion of the pixel region can have an electric potential that is sufficiently low to generate photocharges. That is, an area of a region capable of generating the photocharges may be significantly smaller than that of the whole pixel region defined by the device isolation layer. By contrast, according to exemplary embodiments of the inventive concept, the pixel region defined by the first device isolation layer 101 may be composed of the n-type the epitaxial layer 100, and thus the whole area of the pixel region can be used as a region capable of generating the photocharges. That is, according to exemplary embodiments of the inventive concept, it is possible to improve a full well capacity property of the CMOS image sensor.

Figure 6:
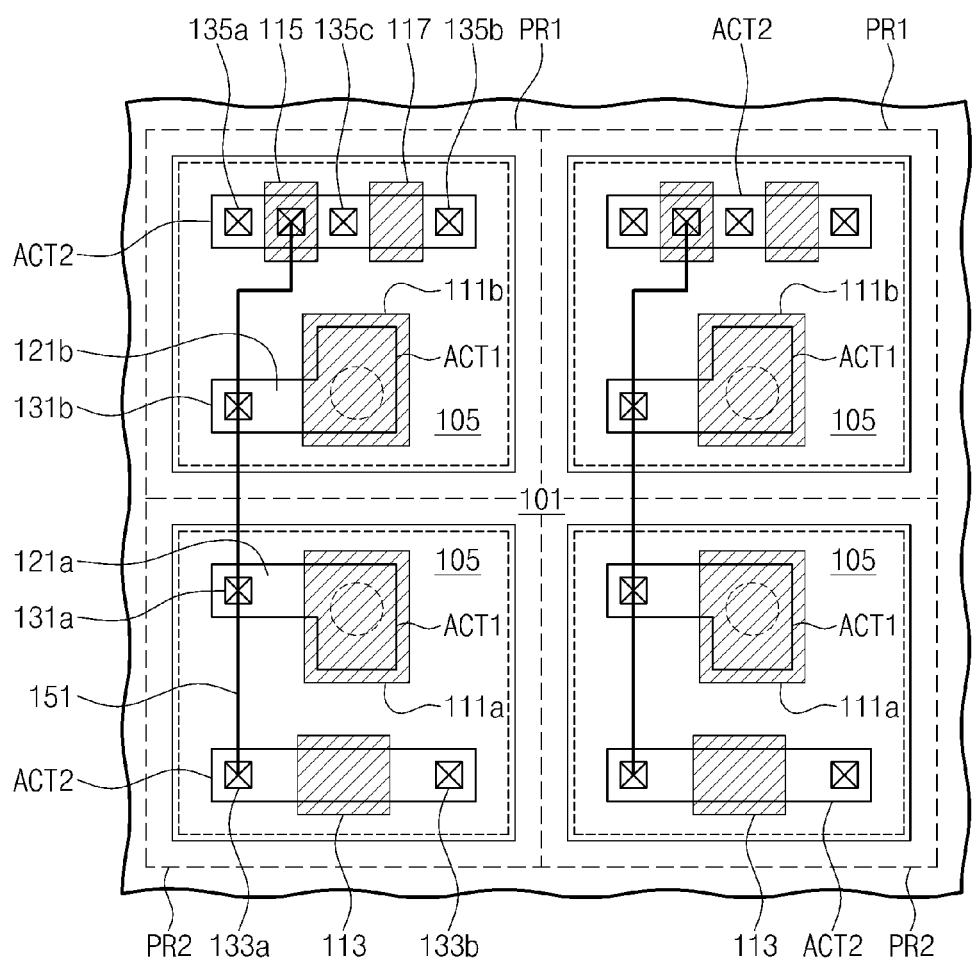
FIG. 6 is a plan view of a CMOS image sensor according to other exemplary embodiments of the inventive concept.

FIG. 6 is a plan view of a CMOS image sensor according to other exemplary embodiments of the inventive concept. For concise description, elements previously described with reference to described with reference to FIG. 3 may be identified by a similar or identical reference number without repeating an overlapping description thereof.

According to the exemplary embodiment shown in FIG. 6, the first and second pixel regions PR1 and PR2 may be defined by the first device isolation layer 101, and each of the first and second pixel regions PR1 and PR2 may include the first and second active portions ACT1 and ACT2 defined by the second device isolation layer 105. In the this exemplary embodiment, the first and second pixel regions PR1 and PR2 may be arranged in the y-axis direction, and when viewed in plan view, in a pair of the first and second pixel regions PR1 and PR2 adjacent to each other in the y-axis direction, the first active portions ACT1 therein may be disposed adjacent to each other. In other words, when viewed in plan view, in the case of the adjacent pair of the first and second pixel regions PR1 and PR2, the first active portions ACT1 thereof may be disposed between the second active portions ACT2 thereof.

The first and second transfer gates 111a and 111b and the first and second floating diffusion regions 121a and 121b may be provided on and in the first active portions ACT1 of the first and second pixel regions PR1 and PR2. The source follower transistor DX (e.g., of FIG. 2A) and the selection transistor SX (e.g., of FIG. 2A) may be formed on the second active portion ACT2 of the first pixel region PR1, and the reset transistor RX (e.g., of FIG. 2A) may be formed on the second active portion ACT2 of the second pixel region PR2. Furthermore, the first and second floating diffusion regions 121a and 121b may be electrically connected to each other by the connection line 151 and may share the logic transistors.

Figure 7:
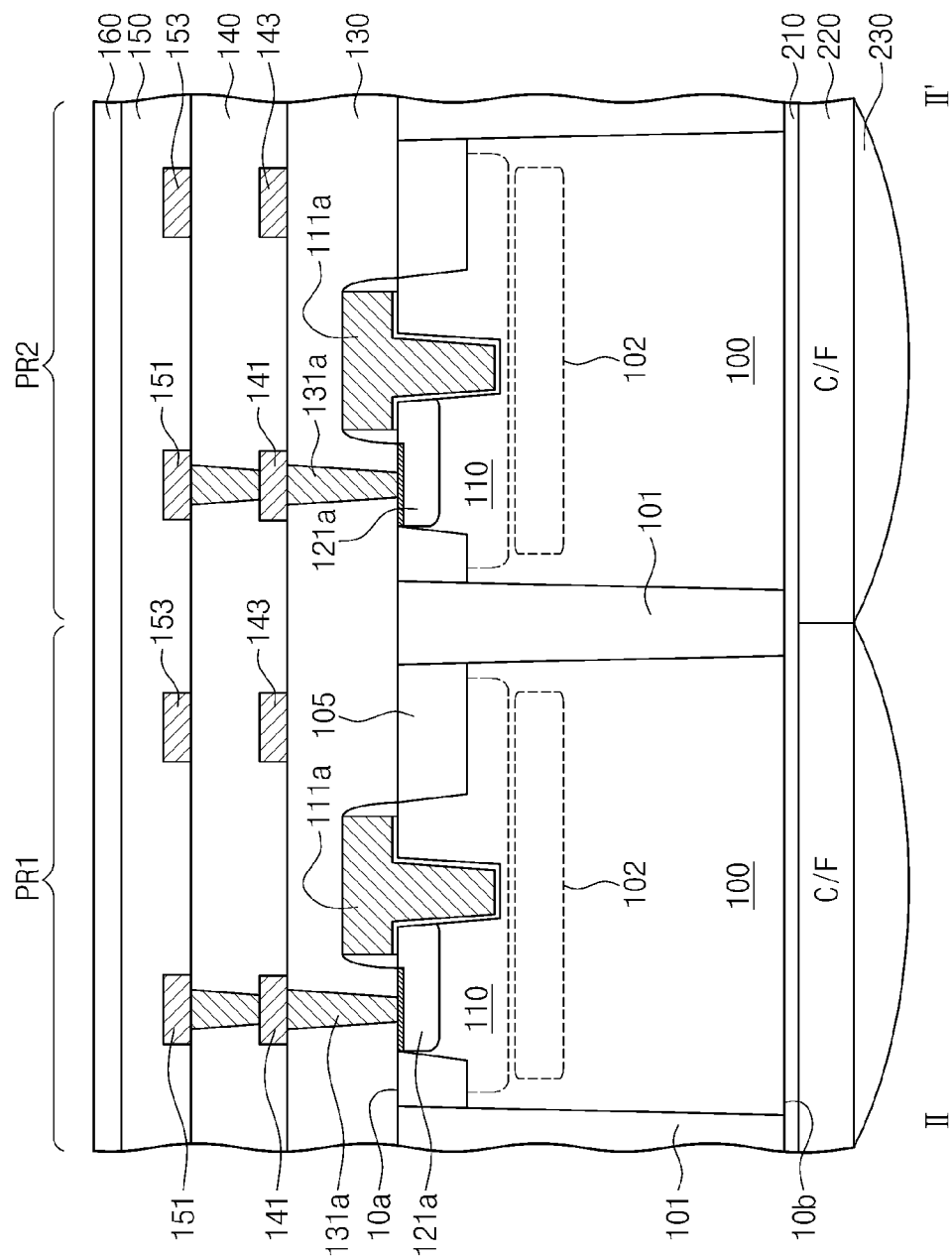
FIG. 7 is a sectional view of a CMOS image sensor according to still other exemplary embodiments of the inventive concept.

FIG. 7 is a sectional view of a CMOS image sensor according to still other exemplary embodiments of the inventive concept. For concise description, elements previously described with reference to described with reference to FIGS. 3, 4A, and 4B may be identified by a similar or identical reference number without repeating an overlapping description thereof.

Referring to FIG. 7, the first and second pixel regions PR1 and PR2 may be defined by the first device isolation layer 101, and each of the first and second pixel regions PR1 and PR2 may include the first and second active portions ACT1 and ACT2 defined by the second device isolation layer 105. In this exemplary embodiment, the first device isolation layer 101 may penetrate the epitaxial layer 100 and may be in direct contact with the epitaxial layer 100. In addition, the first device isolation layer 101 may be formed of an insulating material, whose refractive index is lower than that of the epitaxial layer 100 (e.g., of silicon). The first device isolation layer 101 may include a plurality of insulating layers.

The well impurity layer 110 having the second conductivity type may be provided in the epitaxial layer 100 of each of the first and second pixel regions PR1 and PR2. The well impurity layer 110 may be provided adjacent to the first surface 10a of the epitaxial layer 100 and may contain p-type impurities. A highly-doped impurity region 102 may be formed in the epitaxial layer 100 and adjacent to the well impurity layer 110. The highly-doped impurity region 102 may have the same conductivity type (e.g., n-type) as the epitaxial layer 100 and have a higher doping concentration than that of the epitaxial layer 100. By forming the highly-doped impurity region 102 to be adjacent to the well impurity layer 110, an electric potential may be increased at the highly-doped impurity region 102. In other words, due to the difference in doping concentration, it is possible to increase a potential gradient of the epitaxial layer 100, in a vertical direction.

Figure 8:
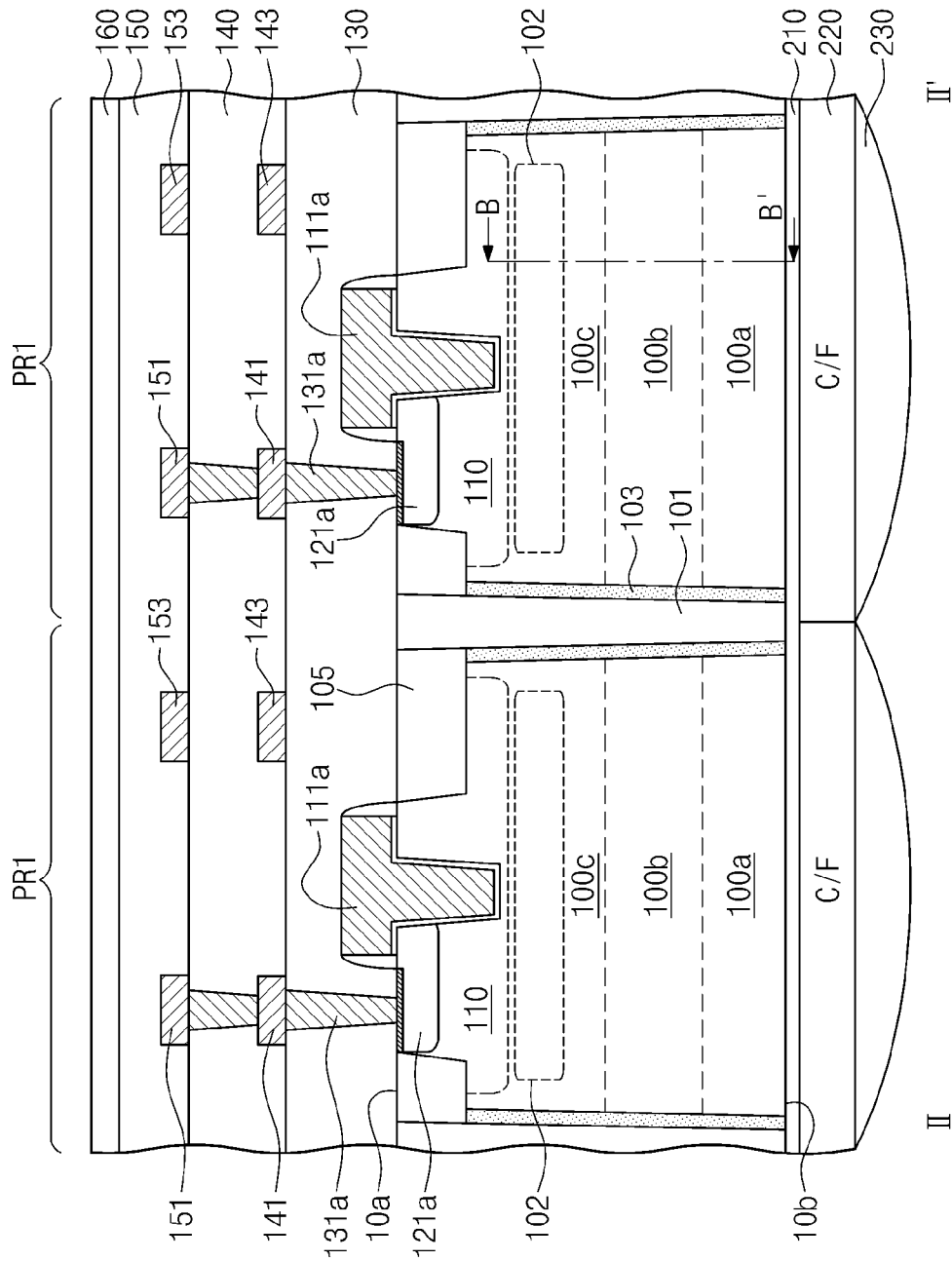
FIG. 8 is a sectional view of a CMOS image sensor according to yet other exemplary embodiments of the inventive concept.

FIG. 8 is a sectional view of a CMOS image sensor according to yet other exemplary embodiments of the inventive concept.

Referring to FIG. 8, the epitaxial layer 100 may be provided to have the first surface 10a and the second surface 10b facing each other and have the first conductivity type. The epitaxial layer 100 may include a first epitaxial layer 100a of a first doping concentration, a second epitaxial layer 100b of a second doping concentration, and a third epitaxial layer 100c of the first doping concentration. The first epitaxial layer 100a may be adjacent to the second surface 10b, the third epitaxial layer 100c may be adjacent to the first surface 10a, and the second epitaxial layer 100b may be disposed between the first epitaxial layer 100a and the third epitaxial layer 100c. The first to third epitaxial layers 100a, 100b, and 100c may be doped to have the first conductivity type (e.g., the n-type). The first doping concentration may be lower than the second doping concentration, and the second doping concentration may be lower than the third doping concentration.

The first device isolation layer 101 may be provided to penetrate the first to third epitaxial layers 100a, 100b, and 100c and define the first and second pixel regions PR1 and PR2. The first device isolation layer 101 may be formed an insulating material, whose refractive index is lower than those of the first to third epitaxial layers 100a, 100b, and 100c (e.g., of silicon).

The potential barrier layer 103 may be formed to enclose the sidewall of the first device isolation layer 101. As described above, the potential barrier layer 103 may be a doped region, which may be formed to have the second conductivity type. In exemplary embodiments, the potential barrier layer 103 may be in contact with the first to third epitaxial layers 100a, 100b, and 100c.

In this exemplary embodiment, the well impurity layer 110 may be formed in the third epitaxial layer 100c of each of the first and second pixel regions PR1 and PR2 and may be doped to have the second conductivity type. The well impurity layer 110 may be disposed adjacent to the first surface 10a of the epitaxial layer 100 and may be of p-type.

Each of the first and second pixel regions PR1 and PR2 may include the first and second active portions ACT1 and ACT2 defined by the second device isolation layer 105, and the first and second active portions ACT1 and ACT2 may be portions of the well impurity layer 110.

The second device isolation layer 105 may be formed in the well impurity layer 110. When measured from the first surface 10a of the epitaxial layer 100, a vertical depth of the second device isolation layer 105 may be smaller than that of the first device isolation layer 101. In certain exemplary embodiments, a bottom surface of the second device isolation layer 105 may be positioned in the well impurity layer 110 or spaced apart from a bottom surface of the well impurity layer 110.

In addition, the highly-doped impurity region 102 may be formed in the third epitaxial layer 100c and adjacent to the well impurity layer 110. The highly-doped impurity region 102 may have the same conductivity type as the third epitaxial layer 100c and have a higher doping concentration than the third doping concentration of the third epitaxial layer 100c.

In some exemplary embodiments, as described with reference to FIG. 3, the first transfer gate 111a and the first floating diffusion region 121a may be provided on and in the first active portion ACT1 of the first pixel region PR1, and the second transfer gate 111b and the second floating diffusion region 121b may be formed on and in the first active portion ACT1 of the second pixel region PR2. As described above, the logic transistors may be formed on the second active portions ACT2 of the first and second pixel regions PR1 and PR2. An interconnection structure may be provided on the second surface 10b of the epitaxial layer 100, and the interconnection structure may include the interconnection lines 141, 143, and 151 and the contact plugs 131a, 131b, 133a, 133b, 135a, 135b, and 135c, which may be connected to the logic transistors.

Figure 9:
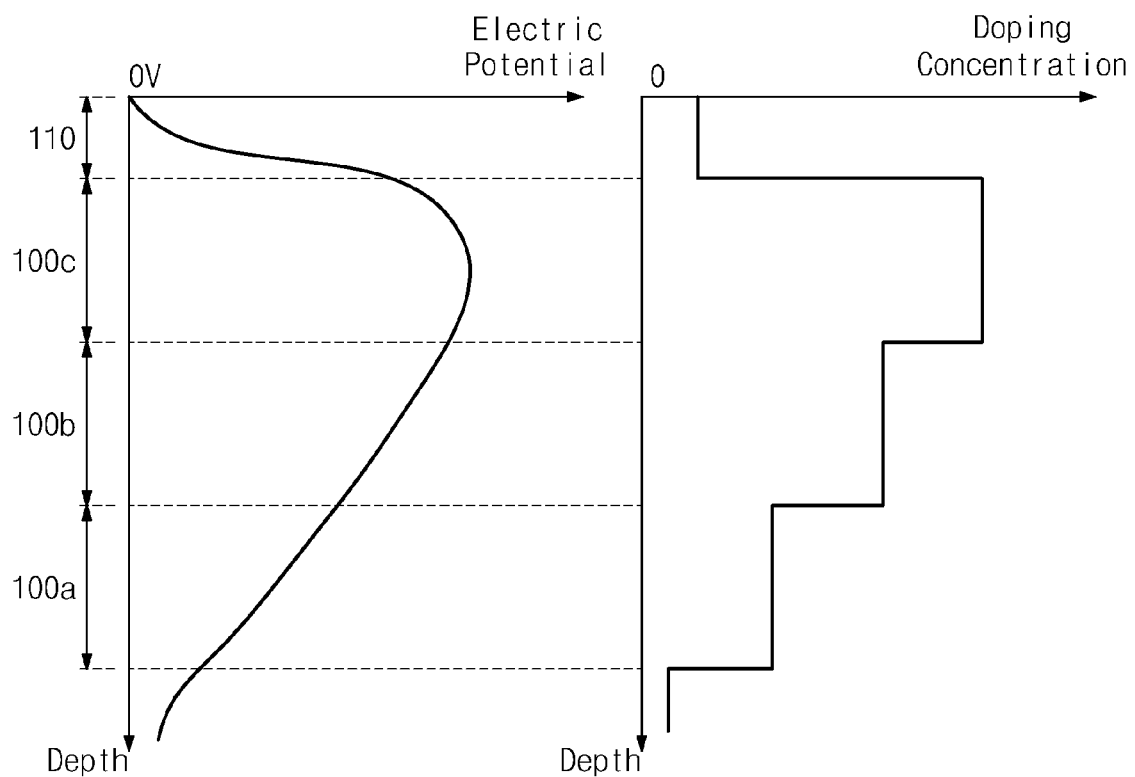
FIG. 9 is a diagram showing an electric potential and a doping profile in a region of the CMOS image sensor of FIG. 8, taken along line B-B' of FIG. 8.

FIG. 9 is a diagram showing an electric potential and a doping profile in a region of a CMOS image sensor according to yet other exemplary embodiments of the inventive concept, taken along line B-B' of FIG. 8.

Referring to FIG. 9, the first to third epitaxial layers 100a, 100b, and 100c may have the same conductivity type (e.g., the first conductivity type) but different doping concentrations. For example, the first to third epitaxial layers 100a, 100b, and 100c may be formed to have the doping concentrations decreasing in a direction from the first surface 10a to the second surface 10b. Due to such a difference in doping concentration between the first to third epitaxial layers 100a, 100b, and 100c, an electric potential in the epitaxial layer may be decreased in the direction from the first surface 10a to the second surface 10b. Furthermore, owing to a non-vanishing gradient in electric potential of the epitaxial layer has, photocharges to be generated in the first epitaxial layer 100a adjacent to the second surface 10b may be moved to and accumulated in the third epitaxial layer 100c. Accordingly, when the transfer gates are turned on, photocharges generated in the third epitaxial layer 100c may not remain in the epitaxial layer and may be more efficiently transferred to the floating diffusion region. This makes it possible to improve imaging properties (e.g., image reproducibility and sensitivity) of a CMOS image sensor.

FIGS. 10 through 13 are sectional views of CMOS image sensors according to additional exemplary embodiments of the inventive concept. For concise description, elements previously described with reference to FIG. 8 may be identified by a similar or identical reference number without repeating an overlapping description thereof.

Figure 10:
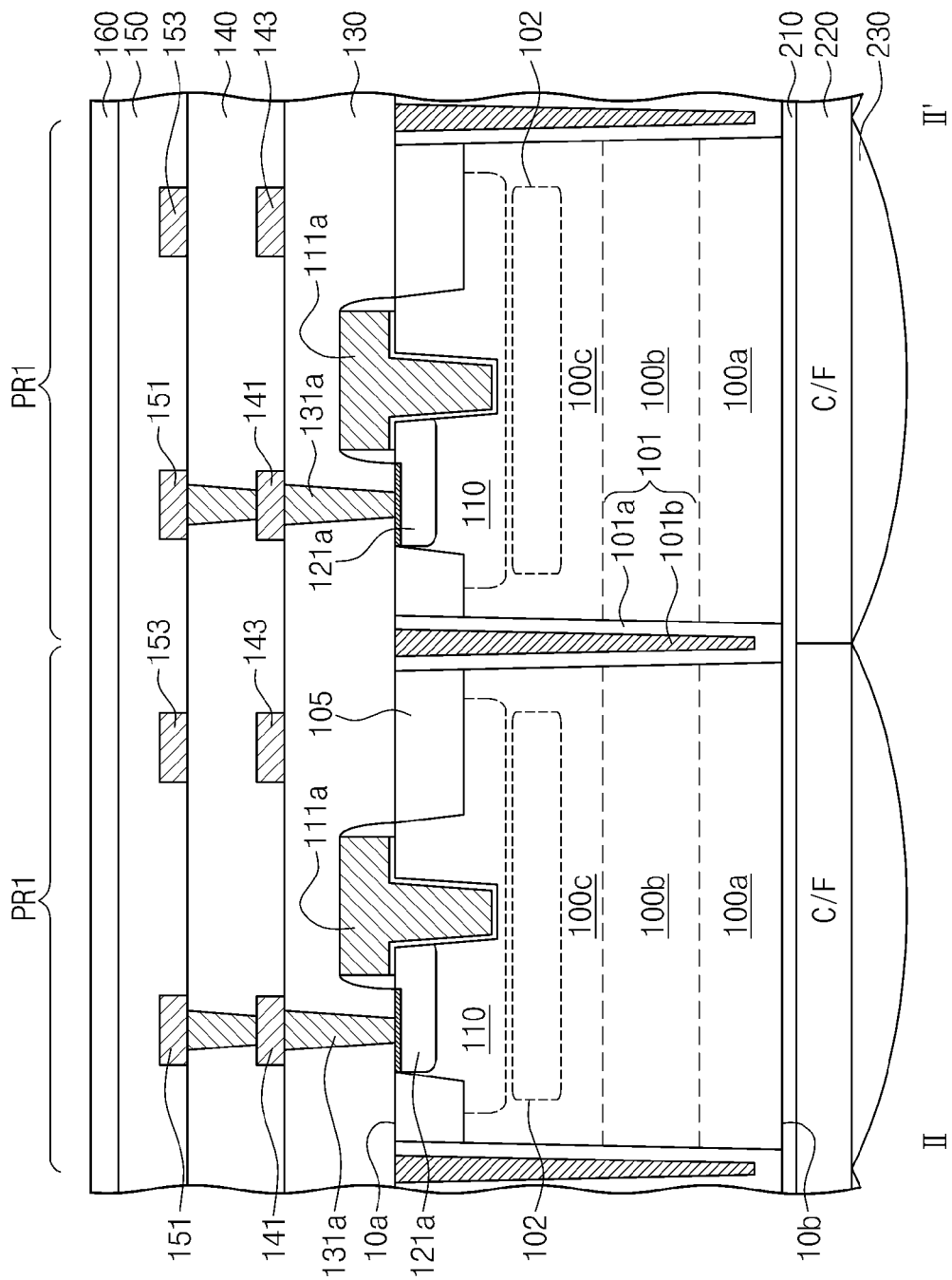
FIGS. 10 through 13 are sectional views of CMOS image sensors according to additional exemplary embodiments of the inventive concept.

According to the exemplary embodiment shown in FIG. 10, the first device isolation layer 101 may be formed to penetrate the first to third epitaxial layers 100a, 100b, and 100c and define the first and second pixel regions PR1 and PR2. Here, the first device isolation layer 101 may include first and second insulating layers 101a and 101b, whose refractive indices are different from each other. A sidewall of the first insulating layer 101a may be in contact with the first to third epitaxial layers 100a, 100b, and 100c, and top surfaces of the first and second insulating layers 101a and 101b may be in contact with a bottom surface of the second device isolation layer 105. Accordingly, a fraction of light being slantingly incident to the first device isolation layer 101 may be reflected by from an interface between the first and second insulating layers 101a and 101b. In other exemplary embodiments, the first device isolation layer 101 may include the silicon oxide layer 101a and the undoped polysilicon layer 101b.

Figure 11:
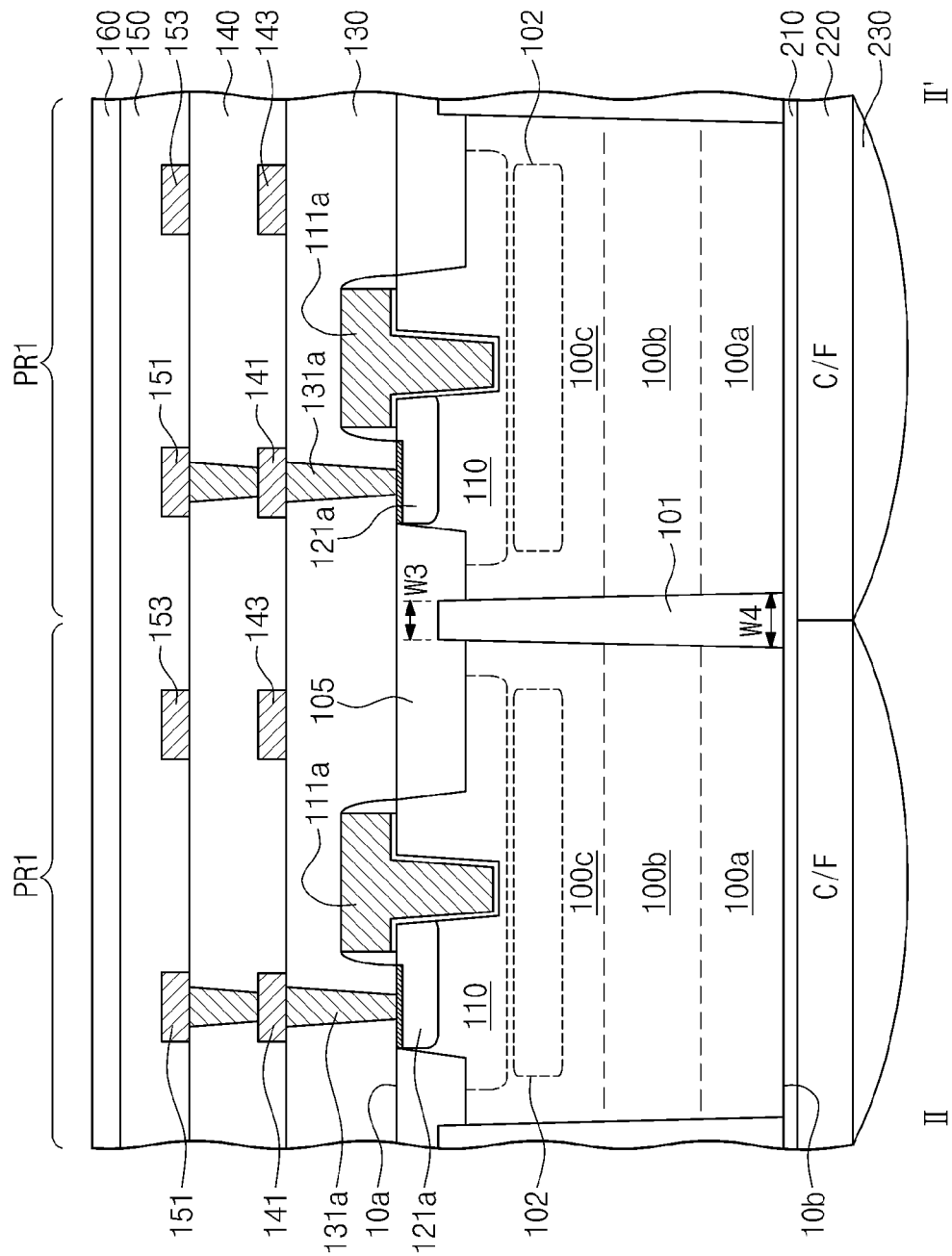
Figure 12:
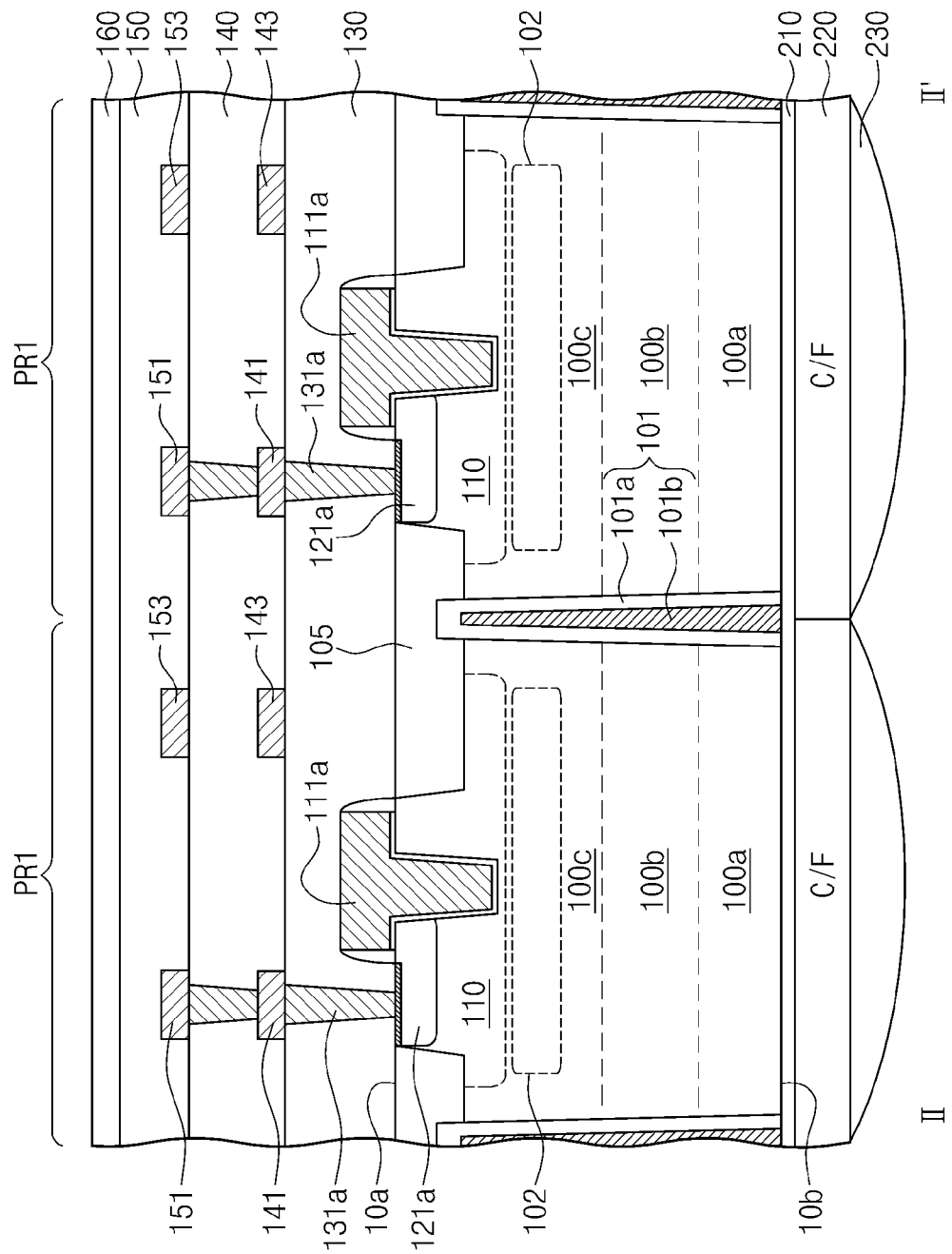

According to the exemplary embodiments shown in FIGS. 11 and 12, the first device isolation layer 101 may be provided to penetrate the first to third epitaxial layers 100a, 100b, and 100c and define the first and second pixel regions PR1 and PR2. In the these exemplary embodiments, the first device isolation layer 101 may extend from the second surface 10b of the epitaxial layer into the second device isolation layer 105, and top and bottom portions of the first device isolation layer 101, which are adjacent to the first and second surfaces 10a and 10b, respectively, of the epitaxial layer, may have an upper width W3 and a lower width W4 greater than the upper width W3, respectively. As an example, the width of the first device isolation layer 101 may increase in a direction from the first surface 10a toward the second surface 10b of the epitaxial layer.

Furthermore, according to the exemplary embodiment of FIG. 11, the first device isolation layer 101 may be formed of an insulating material and may be in direct contact with the first to third epitaxial layers 100a, 100b, and 100c. According to the exemplary embodiment of FIG. 12, the first device isolation layer 101 may include the first and second insulating layers 101a and 101b having refractive indices different from each other. The first insulating layer 101a may have a sidewall that is in contact with the first to third epitaxial layers 100a, 100b, and 100c and may include a portion interposed between the second device isolation layer 105 and the second insulating layer 101b.

Figure 13:
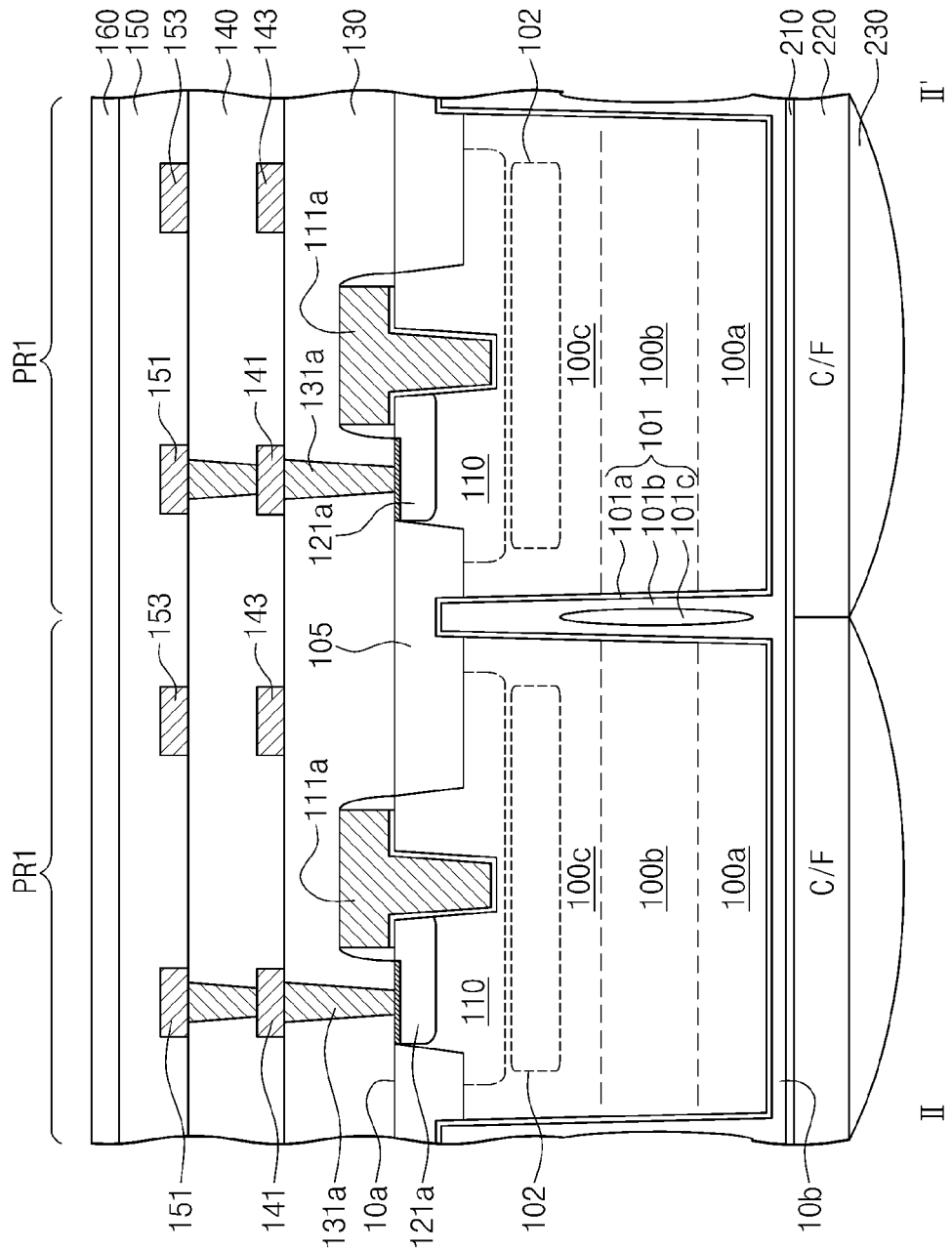

According to the exemplary embodiment of FIG. 13, the first device isolation layer 101 may extend from the second surface 10b of the epitaxial layer into the second device isolation layer 105, and top and bottom portions of the first device isolation layer 101, which are adjacent to the first and second surfaces 10a and 10b, respectively, of the epitaxial layer, may have an upper width and a lower width greater than the upper width, respectively. Here, the first device isolation layer 101 may include a liner insulating layer 101a, an insulating gapfill layer 101b, and an air gap 101c formed in the insulating gapfill layer 101b. Further, in exemplary embodiments, the liner insulating layer 101a and the insulating gapfill layer 101b may be extended to cover the second surface 10b of the epitaxial layer.

Figure 14:
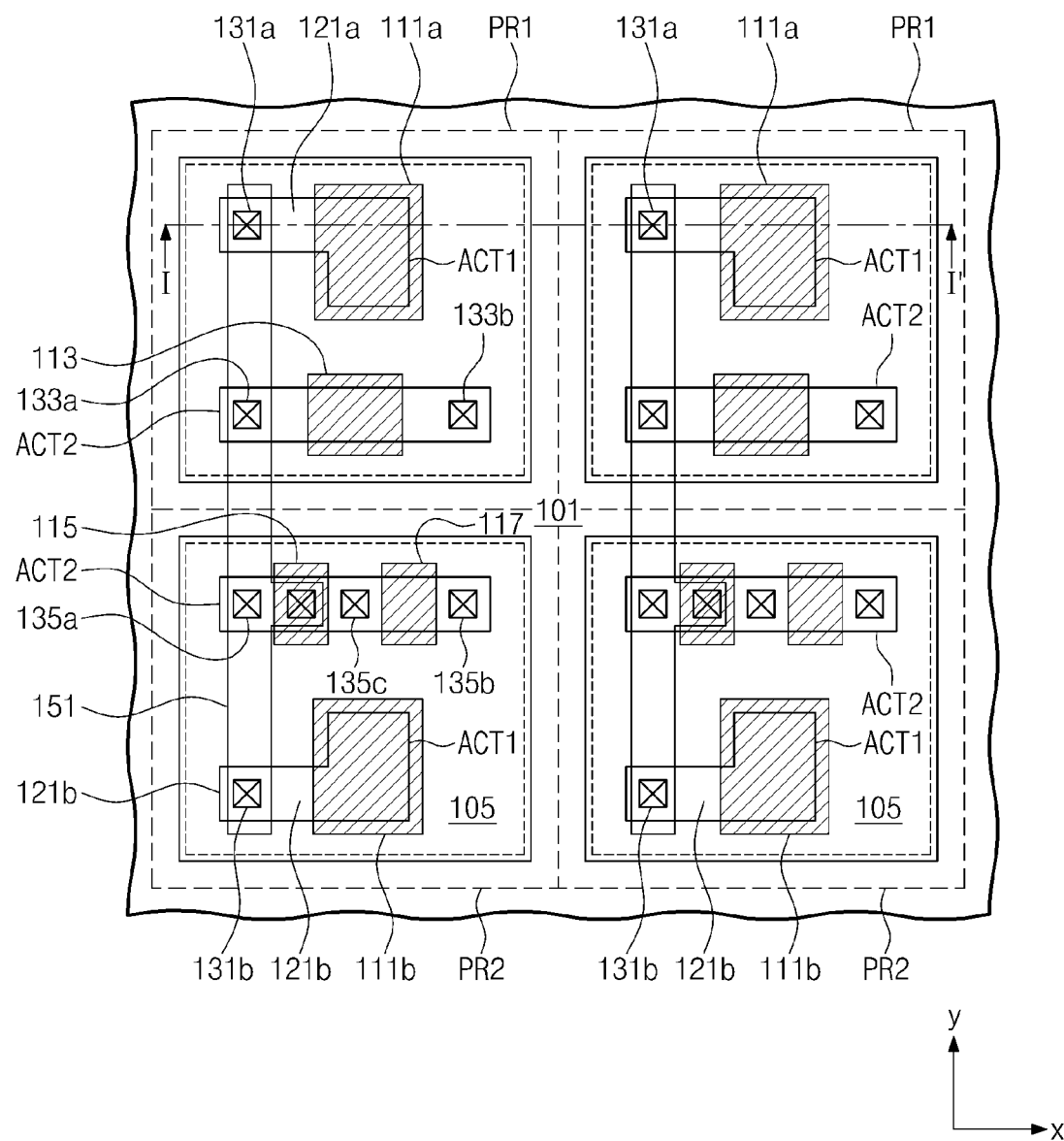
FIG. 14 is a plan view of a CMOS image sensor according to further exemplary embodiments of the inventive concept.
Figure 15:
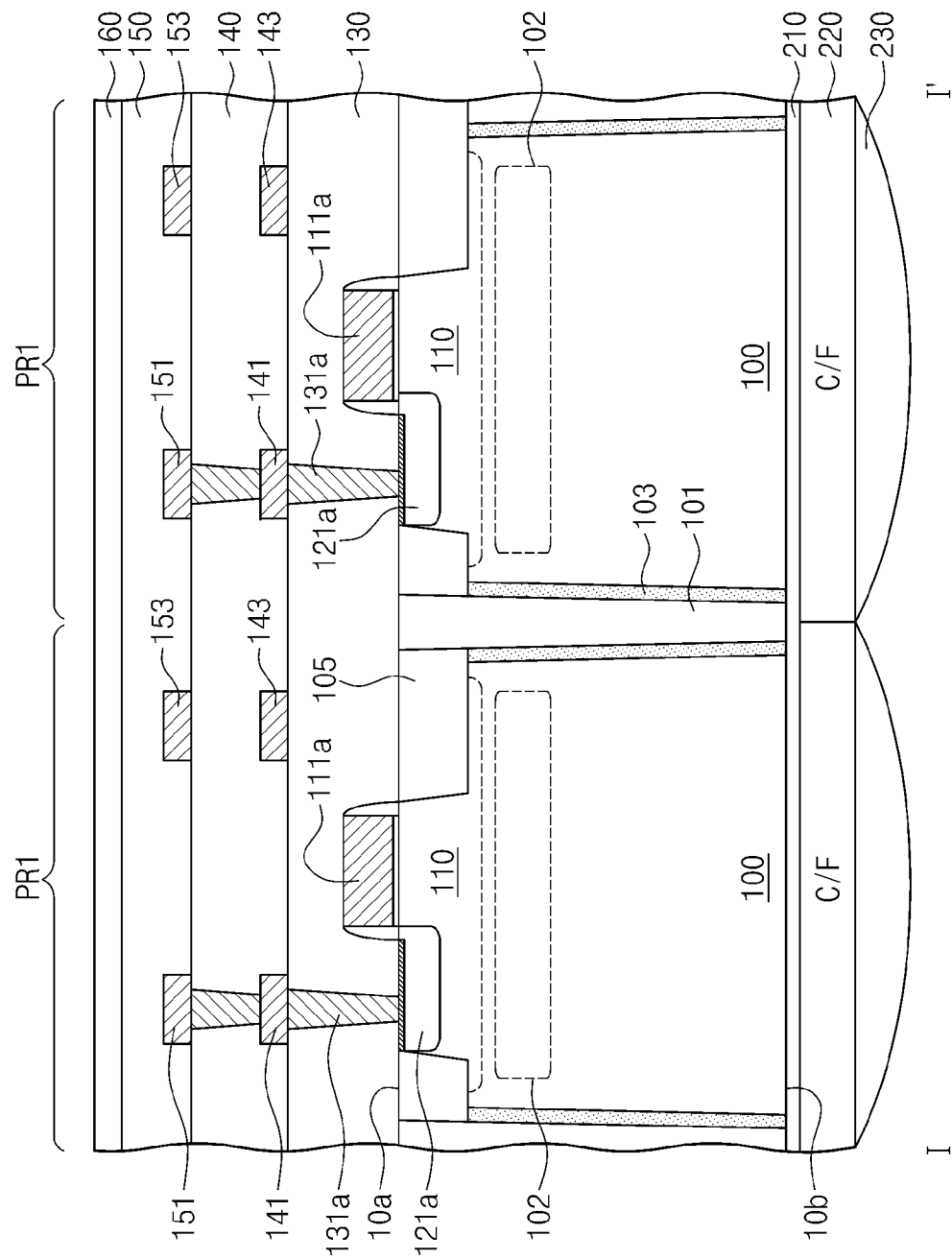
FIG. 15 is a sectional view of the CMOS image sensor of FIG. 14, taken along line I-I' of FIG. 14.

FIG. 14 is a plan view of a CMOS image sensor according to further exemplary embodiments of the inventive concept. FIG. 15 is a sectional view of a CMOS image sensor of FIG. 14, taken along line I-I' of FIG. 14. For concise description, elements previously described with reference to FIGS. 3, 4A, and 4B may be identified by a similar or identical reference number without repeating an overlapping description thereof.

Referring to FIGS. 14 and 15, a CMOS image sensor may include the epitaxial layer 100 having the first surface 10a and the second surface 10b facing each other and having the first conductivity type. The epitaxial layer 100 may include the first pixel region PR1 and the second pixel region PR2 defined by the first device isolation layer 101. Each of the first and second pixel regions PR1 and PR2 may include the first active portion ACT1 and the second active portion ACT2 defined by the second device isolation layer 105.

The first device isolation layer 101 may extend from the first surface 10a of the epitaxial layer 100 to the second surface 10b in the vertical direction. The potential barrier layer 103 may be formed to enclose the sidewall of the first device isolation layer 101. Here, the potential barrier layer 103 may be formed to have the second conductivity type.

The well impurity layer 110 may be formed in the epitaxial layer 100 of each of the first and second pixel regions PR1 and PR2. The well impurity layer 110 may be formed adjacent to the first surface 10a of the epitaxial layer 100. The second device isolation layer 105 may be formed in the well impurity layer 110 to define the first and second active portions ACT1 and ACT2 spaced apart from each other.

In some exemplary embodiments, the epitaxial layer 100 may include the highly-doped impurity region 102 that is formed adjacent to the well impurity layer 110. The highly-doped impurity region 102 may have the same conductivity type (e.g., n-type) as that of the epitaxial layer 100.

The first transfer gate 111a and the first floating diffusion region 121a may be disposed on and in the first active portion ACT1 of the first pixel region PR1, and the second transfer gate 111b and the second floating diffusion region 121b may be disposed on and in the first active portion ACT1 of the second pixel region PR2.

In this exemplary embodiment, the first and second transfer gates 111a and 111b may be disposed on the first surface 10a of the epitaxial layer 100 and may have flat bottom surfaces. In other words, the first and second transfer gates 111a and 111b may be disposed on the well impurity layer 110 with a gate insulating layer interposed therebetween. That is, as compared with the earlier exemplary embodiments, the first and second transfer gates 111a and 111b do not extend into the well impurity layer 110. Each of the first and second transfer gates 111a and 111b may be disposed to cover the area of the first active portion ACT1, except for the first and second floating diffusion regions 121a and 121b. In some exemplary embodiments, the first and second transfer gates 111a and 111b may be disposed to cover the whole area of the first active portion ACT1, except for the first and second floating diffusion regions 121a and 121b.

Further, the logic transistors may be formed on the second active portions ACT2 of the first and second pixel regions PR1 and PR2. The first and second pixel regions PR1 and PR2 may share the logic transistors.

FIGS. 16 through 24 are sectional views illustrating a method of fabricating a CMOS image sensor according to exemplary embodiments of the inventive concept.

Figure 16:
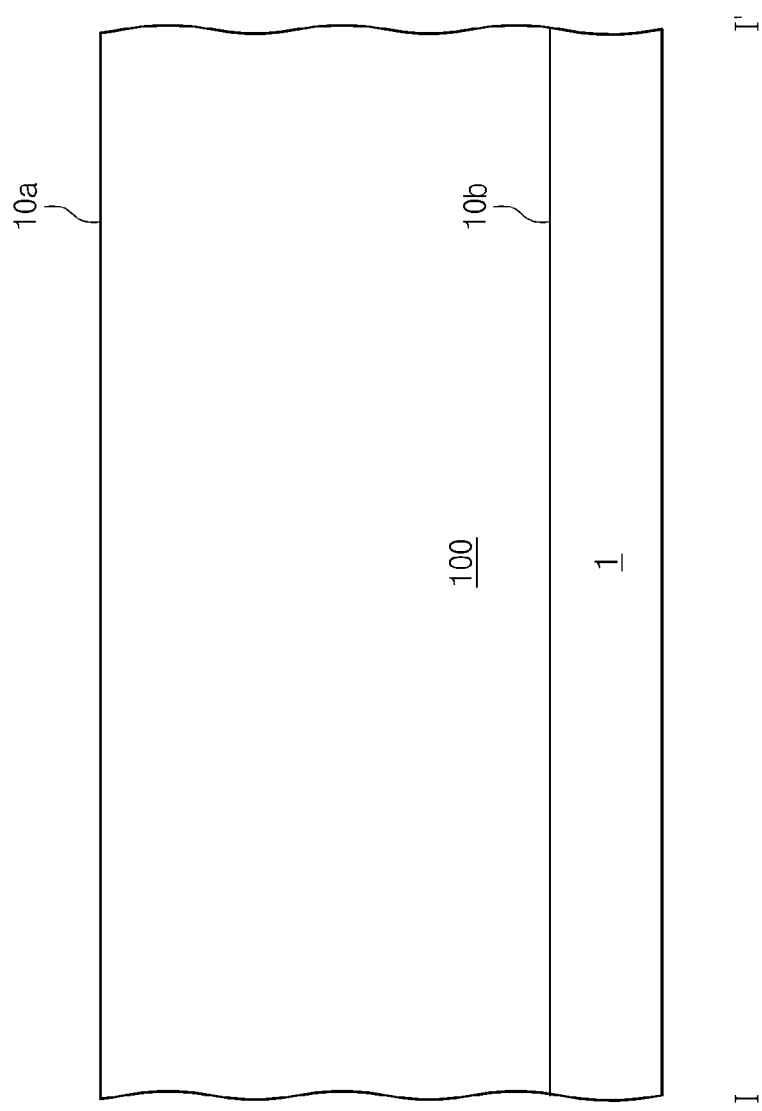
FIGS. 16 through 24 are sectional views illustrating a method of fabricating a CMOS image sensor according to exemplary embodiments of the inventive concept.

Referring to FIG. 16, the epitaxial layer 100 having the first conductivity type may be formed on a semiconductor substrate 1.

In some exemplary embodiments, the semiconductor substrate 1 may be an n-type or p-type of bulk silicon wafer. In other exemplary embodiments, the semiconductor substrate 1 may be a silicon-on-insulator (SOI) substrate, a germanium substrate, a germanium-on-insulator (GOI) substrate, or a silicon-germanium substrate. The epitaxial layer 100 may be formed by a selective epitaxial growth (SEG) process, in which the semiconductor substrate 1 is used a seed layer. In certain exemplary embodiments, during the epitaxial growth process, the epitaxial layer 100 may be doped with impurities to have the first conductivity type. For example, the epitaxial layer 100 may contain n-type impurities. In some exemplary embodiments, the epitaxial layer 100 may have the first surface 10a and the second surface 10b facing each other. Here, the second surface 10b of the epitaxial layer 100 may be in contact with the semiconductor substrate 1. In some exemplary embodiments, the epitaxial layer 100 may be formed in such a way that a doping concentration thereof decreases in a direction from the first surface 10a toward the second surface 10b.

In other exemplary embodiments, the epitaxial layer 100 may include a plurality of epitaxial layers. For example, as shown in FIG. 8, the first epitaxial layer 100a, the second epitaxial layer 100b, and the third epitaxial layer 100c may be formed on the semiconductor substrate 1. Each of the first to third epitaxial layers 100a, 100b, and 100c may be formed using by a selective epitaxial growth (SEG) process, in which the semiconductor substrate 1 or an underlying layer is used a seed layer. The first to third epitaxial layers 100a, 100b, and 100c may be formed to contain n-type impurities. Here, the first epitaxial layer 100a may be formed to have a first doping concentration, the second epitaxial layer 100b may be formed to have a second doping concentration higher than the first doping concentration, and the third epitaxial layer 100c may be formed to have a third doping concentration higher than the second doping concentration.

Figure 17:
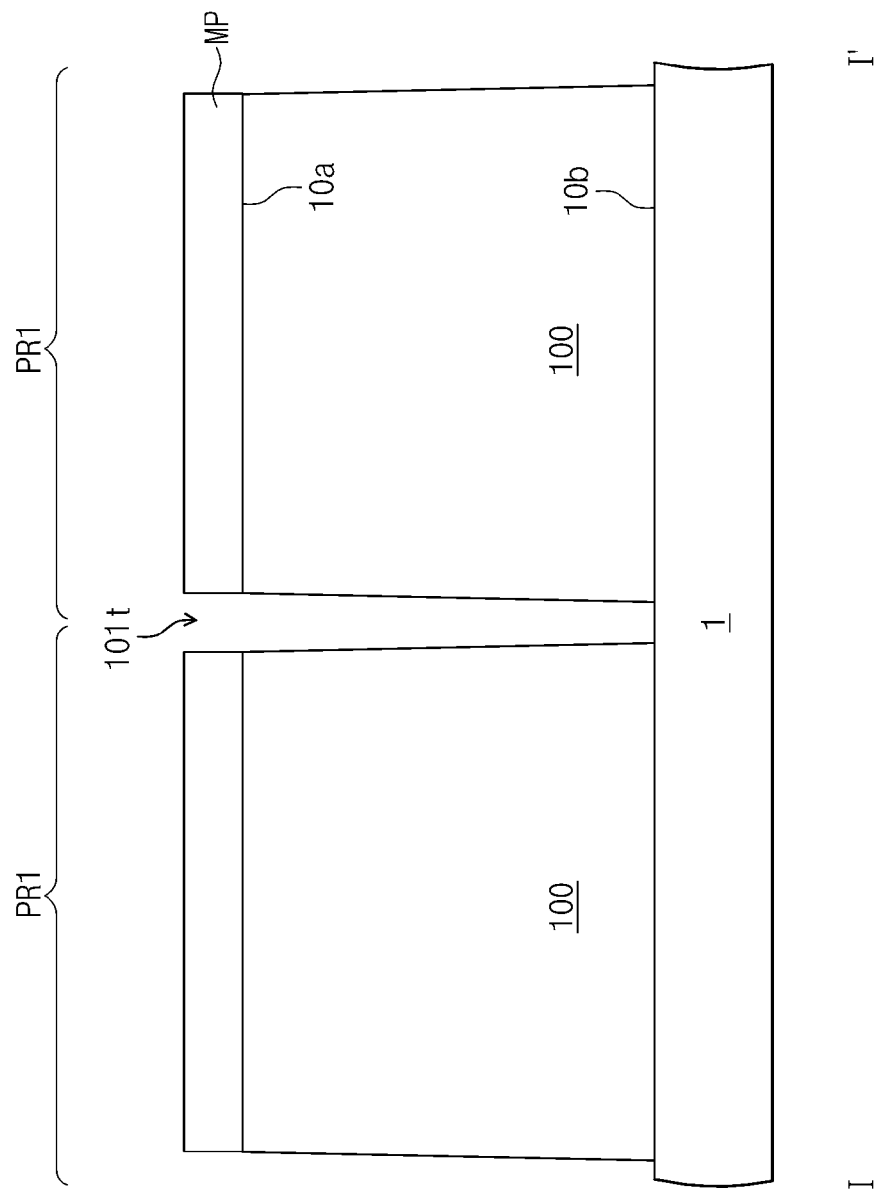

Referring to FIG. 17, the first surface 10a of the epitaxial layer 100 may be patterned to form a deep trench 101t defining the pixel regions. For example, the epitaxial layer 100 may separate pixel regions PR1 and PR1 (see, e.g., FIG. 4A), or may separate pixel regions PR1 and PR2 (see, e.g., FIG. 4B). It should be noted that FIGS. 17-31 show an epitaxial layer 100 separating pixel regions PR1 and PR1 for convenience. However, the description below is similar for an epitaxial layer 100 separating pixel regions PR1 and PR1 and for an epitaxial layer 100 separating pixel regions PR1 and PR2.

For example, the formation of the deep trench 101t may include forming a mask pattern MP on the first surface 10a of the epitaxial layer 100, anisotropically etching the epitaxial layer 100 using the mask pattern MP as an etch mask. The mask pattern MP may be formed of or include a silicon nitride layer or a silicon oxynitride layer. The deep trench 101t may be formed to extend from the first surface 10a of the epitaxial layer 100 toward the second surface 10b and expose the semiconductor substrate 1. Since the deep trench 101t is formed using the anisotropic etching process, surface defects, such as dangling bonds, may occur on a surface of the deep trench 101t.

Figure 18:
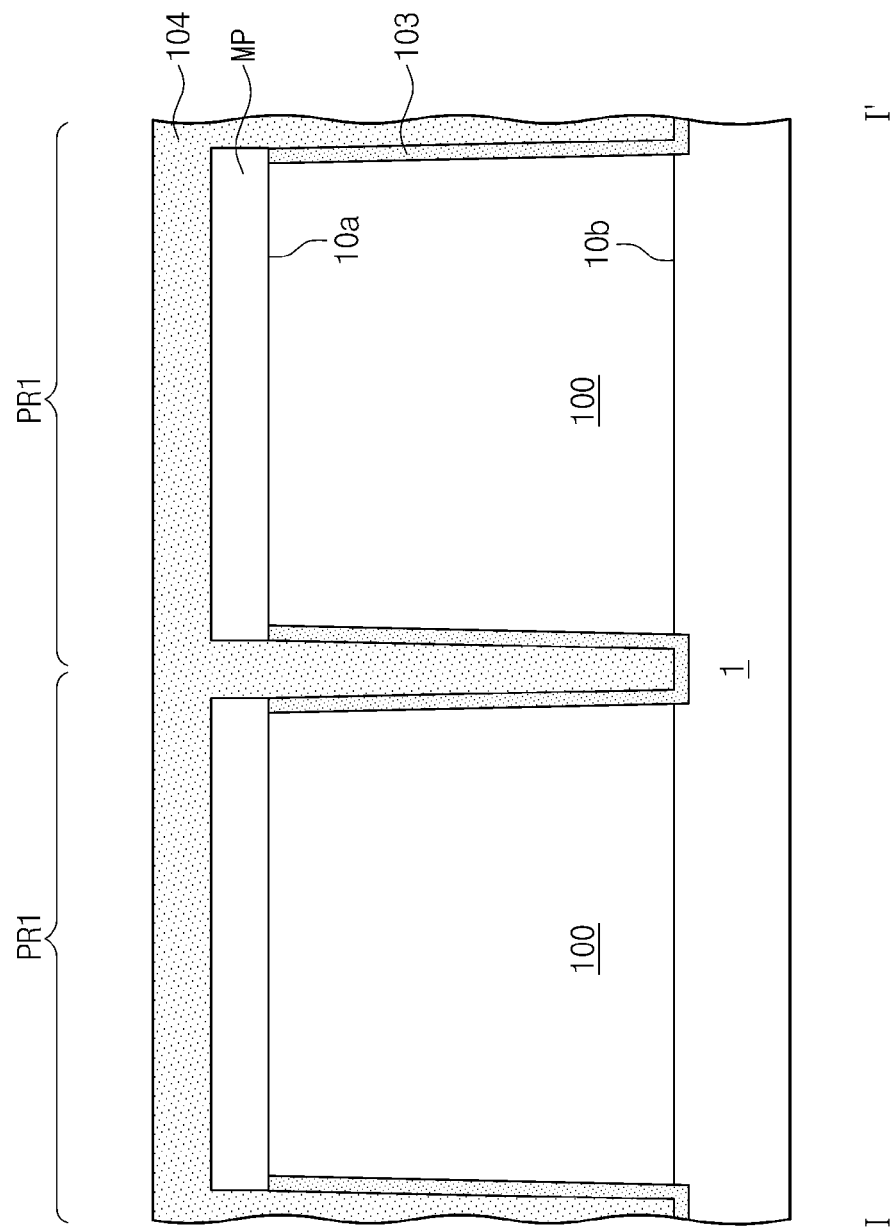

Referring to FIG. 18, the potential barrier layer 103 may be formed to cover the surface of the deep trench 101t. The potential barrier layer 103 may be formed to have a conductivity type different from or opposite to that of the epitaxial layer 100. For example, the potential barrier layer 103 may be formed to have the second conductivity type or contain p-type impurities.

In some exemplary embodiments, the formation of the potential barrier layer 103 may include forming a sacrificial layer 104 containing the second conductivity type of impurities in the deep trench 101t and performing a thermal treatment process to diffuse the impurities from the sacrificial layer 104 to the epitaxial layer 100. For example, the potential barrier layer 103 may contain p-type impurities. After the potential barrier layer 103 is formed on the surface of the deep trench 101t, the sacrificial layer 104 and the mask pattern MP may be removed.

Figure 19:
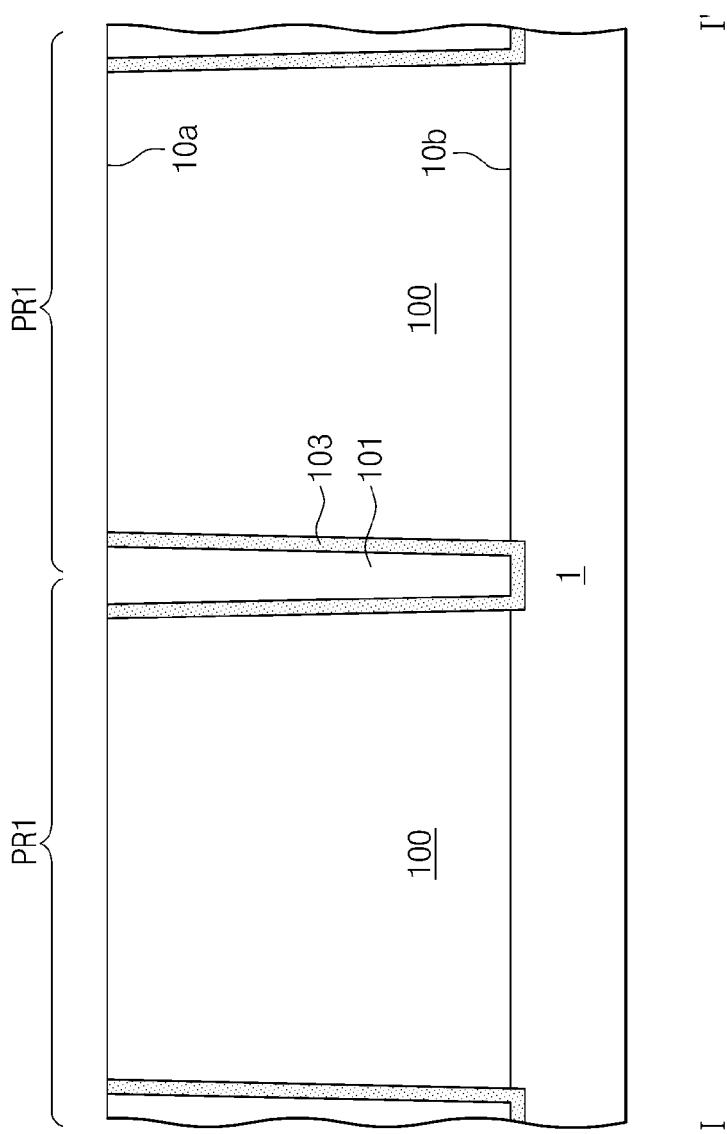

Referring to FIG. 19, the first device isolation layer 101 may be formed in the deep trench 101t, after the formation of the potential barrier layer 103. The formation of the first device isolation layer 101 may include forming an insulating layer to fill the deep trench 101t and planarizing the insulating layer to expose the second surface 10b of the epitaxial layer 100.

In some exemplary embodiments, the first device isolation layer 101 may be formed to define a plurality of pixel regions (e.g., PR1 and PR2 of FIG. 3) which are two-dimensionally arranged on the epitaxial layer 100. In other words, when viewed in a plan view, the epitaxial layer 100 of each pixel region may be enclosed by the first device isolation layer 101 or may be formed to have an island shape.

Figure 20:
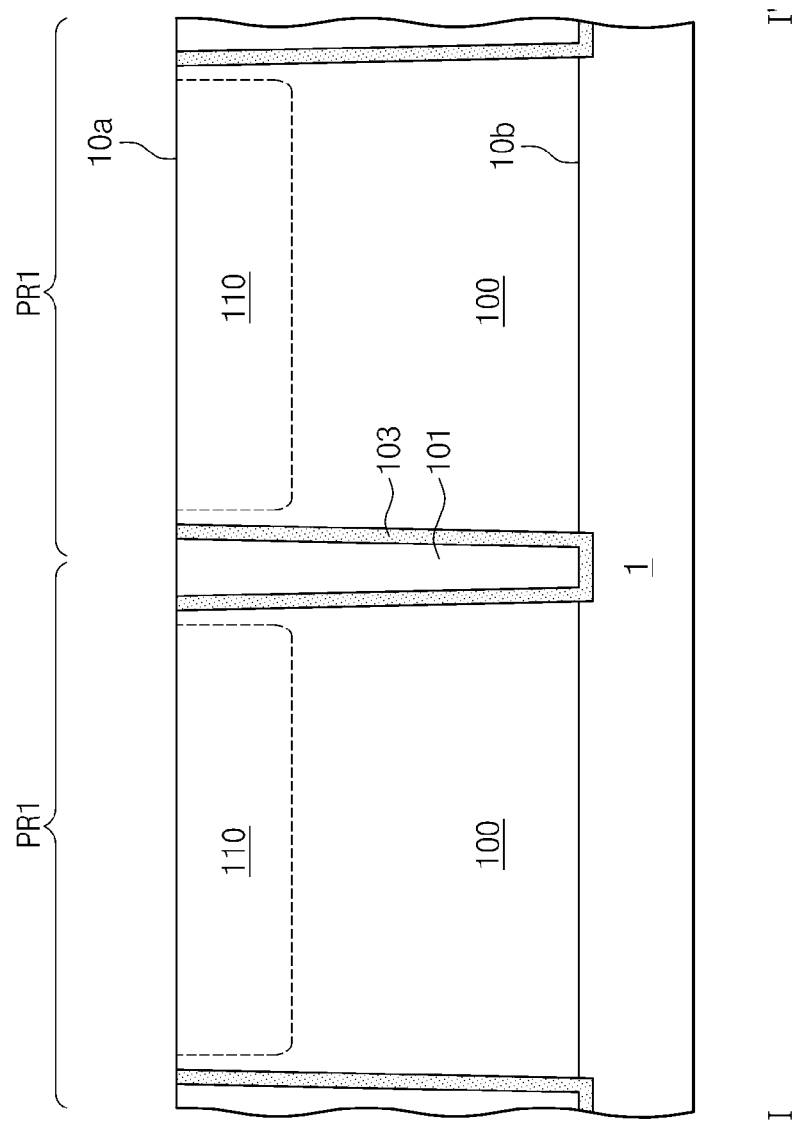

Referring to FIG. 20, the well impurity layer 110 may be formed in each of the pixel regions PR1 and PR2. The well impurity layer 110 may be formed by injecting impurities into a top portion of the epitaxial layer 100 adjacent to the first surface 10a. Here, the well impurity layer 110 may be formed to have the second conductivity type. In some exemplary embodiments, the well impurity layer 110 may have a doping concentration lower than that of the potential barrier layer 103. In other exemplary embodiments, the well impurity layer 110 may be formed using an ion implantation process, before the formation of the deep trench 101t.

Figure 21:
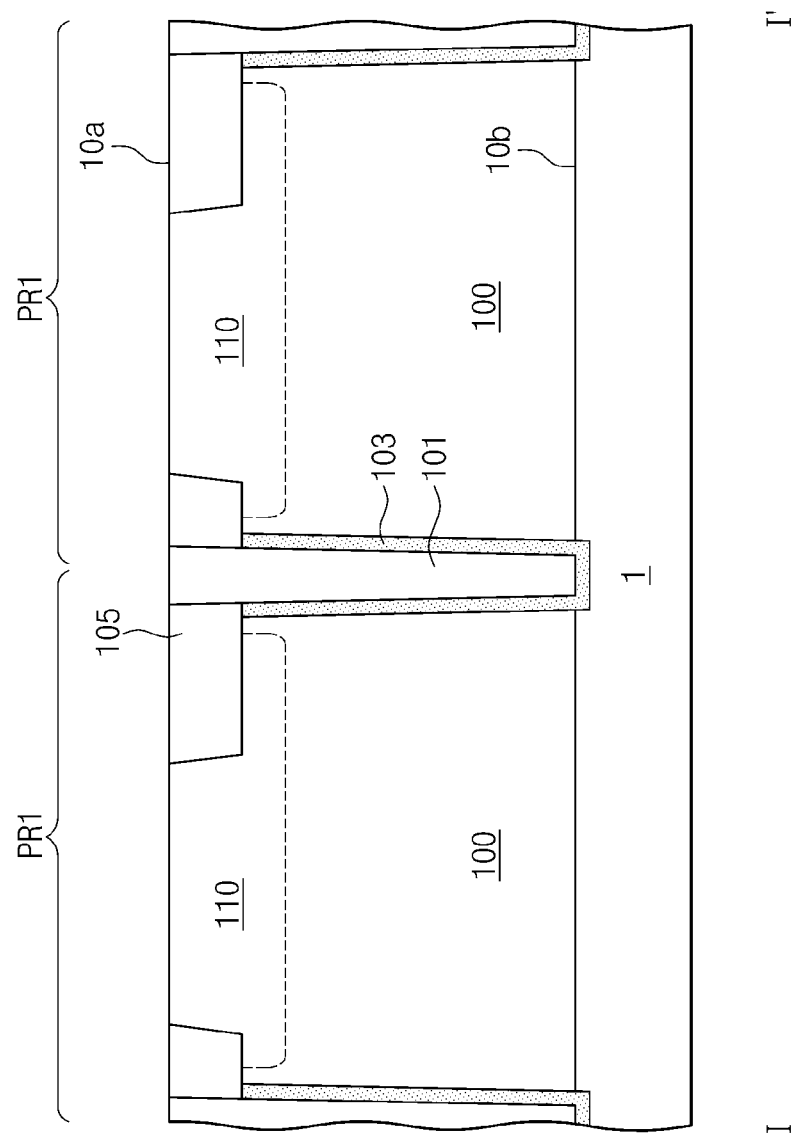

Referring to FIG. 21, the second device isolation layer 105 may be formed in the well impurity layer 110 to define the first and second active portions (e.g., ACT1 and ACT2 of FIG. 3) spaced apart from each other. The formation of the second device isolation layer 105 may include patterning the epitaxial layer 100 to form a shallow trench adjacent to the first surface 10a and depositing an insulating material to fill the shallow trench. The second device isolation layer 105 may be formed adjacent to the first surface 10a of the epitaxial layer 100 and may have a bottom surface positioned in the well impurity layer 110.

The first and second active portions (e.g., ACT1 and ACT2 of FIG. 3) defined by the second device isolation layer 105 may be portions of the well impurity layer 110 and may have areas different from each other.

Figure 22:
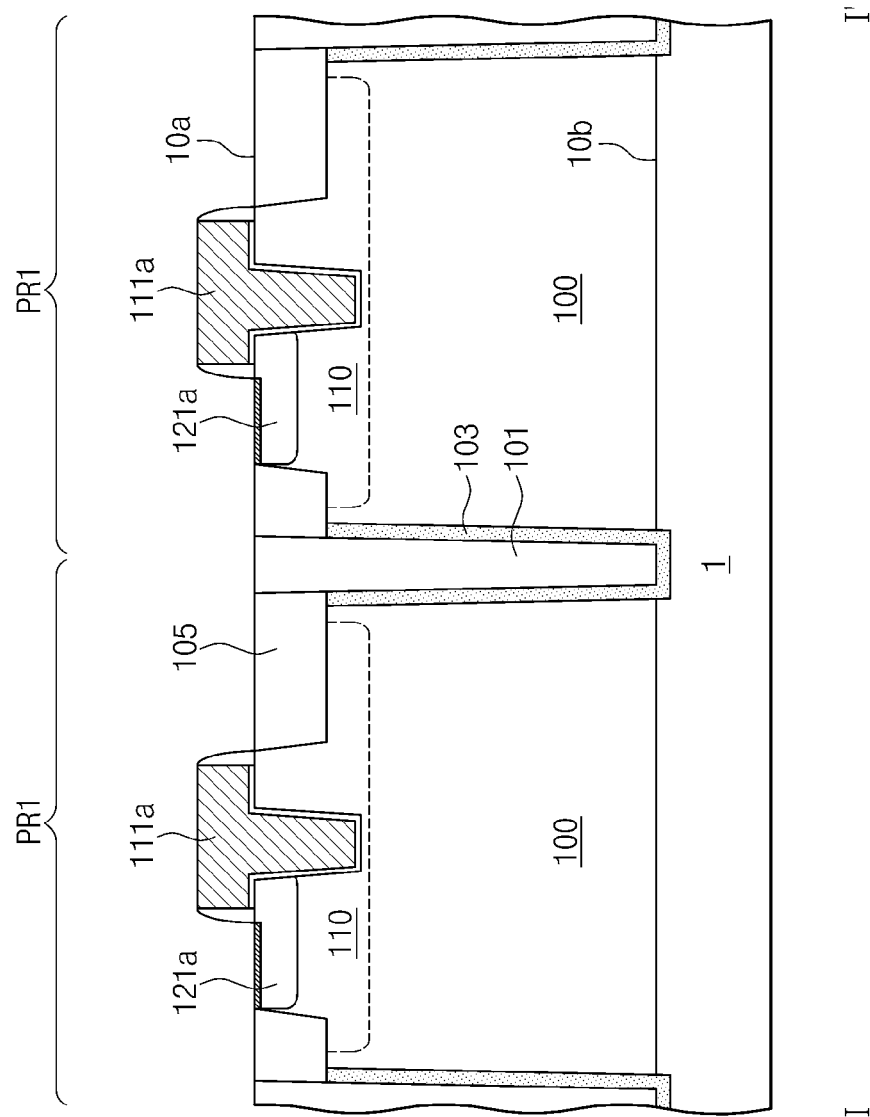

Referring to FIG. 22, the charge transfer transistors and the logic transistors may be formed on the first surface 10a of the epitaxial layer 100.

As described with reference to FIG. 3, the first transfer gate 111a and the first floating diffusion region 121a may be formed on and in the first active portion ACT1 of the first pixel region PR1, and the second transfer gate 111b and the second floating diffusion region 121b may be formed on and in the first active portion ACT1 of the second pixel region PR2. The logic transistors may be formed on the second active portions ACT2 of the first and second pixel regions PR1 and PR2.

For example, the formation of the first and second transfer gates 111a and 111b may include patterning the well impurity layer 110 to form a gate recess region in each of the first and second pixel regions PR1 and PR2, forming a gate insulating layer to conformally cover an inner surface of the gate recess region, forming a gate conductive layer to fill the gate recess region provided with the gate insulating layer, and then, patterning the gate conductive layer. When the gate conductive layer is patterned to form the first and second transfer gates 111a and 111b, gate electrodes of the logic transistors may be formed on the second active portions ACT2.

The first and second floating diffusion regions 121a and 121b may be formed by injecting the first conductivity type of impurities into a portion of the well impurity layer 110 using the first and second transfer gate 111a and 111b as a mask. When the first and second floating diffusion regions 121a and 121b are formed, source/drain impurity regions of the logic transistors may be formed in the well impurity layer 110 of the second active portion ACT2.

Figure 23:
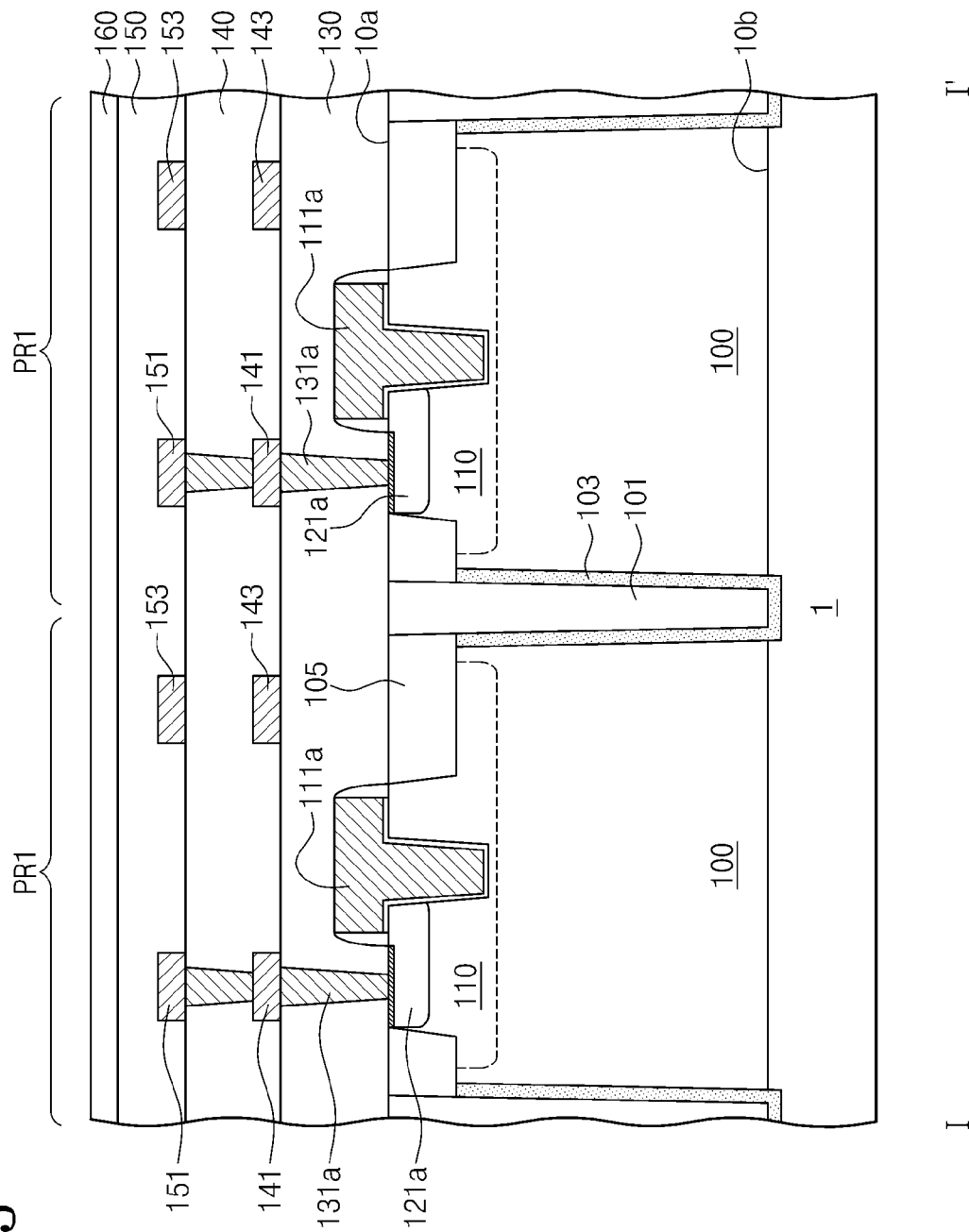

Referring to FIG. 23, the interlayered insulating layers 130, 140, and 150, the contact plugs (e.g., 131a, 131b, 133a, 133b, 135a, 135b, and 135g of FIG. 3), and the interconnection lines 141, 143, 151, and 153 may be formed on the first surface 10a of the epitaxial layer 100. The passivation layer 160 may be formed on the interlayered insulating layer 150.

For example, the interlayered insulating layers 130, 140, and 150 may be formed on the first surface 10a of the epitaxial layer 100 to cover the first and second transfer transistors and the logic transistors. The contact plugs 131a, 131b, 133a, 133b, 135a, 135b, and 135g may be formed in the interlayered insulating layers 130, 140, and 150, and the interconnection lines 141, 143, 151, and 153 may be formed to be interposed between the interlayered insulating layers 130, 140, and 150. In some exemplary embodiments, the interconnection lines 141, 143, 151, and 153 may be provided for electric connection to the logic transistors, without any limitation of position and arrangement. Furthermore, as described with reference to FIG. 3, the connection line 151 may be formed to connect the first floating diffusion region 121a of the first pixel region PR1 electrically with the second floating diffusion region 121b of the second pixel region PR2.

The interlayered insulating layers 130, 140, and 150 may be formed of a material having a good gap-fill property, and each of the interlayered insulating layers 130, 140, and 150 may be planarized to have a flat top surface. At least one or each of the interlayered insulating layers 130, 140, and 150 may be formed of or include, for example, at least one of high density plasma (HDP) oxide, Tonen SilaZene (TOSZ), spin on glass (SOG), or undoped silica glass (USG).

The contact plugs 131a, 131b, 133a, 133b, 135a, 135b, and 135g and the interconnection lines 141, 143, 151, and 153 may be formed of or include at least one of, for example, copper (Cu), aluminum (Al), tungsten (W), titanium (Ti), molybdenum (Mo), tantalum (Ta), titanium nitride (TiN), tantalum nitride (TaN), zirconium nitride (ZrN), tungsten nitride (TiN), or alloys thereof.

Figure 24:
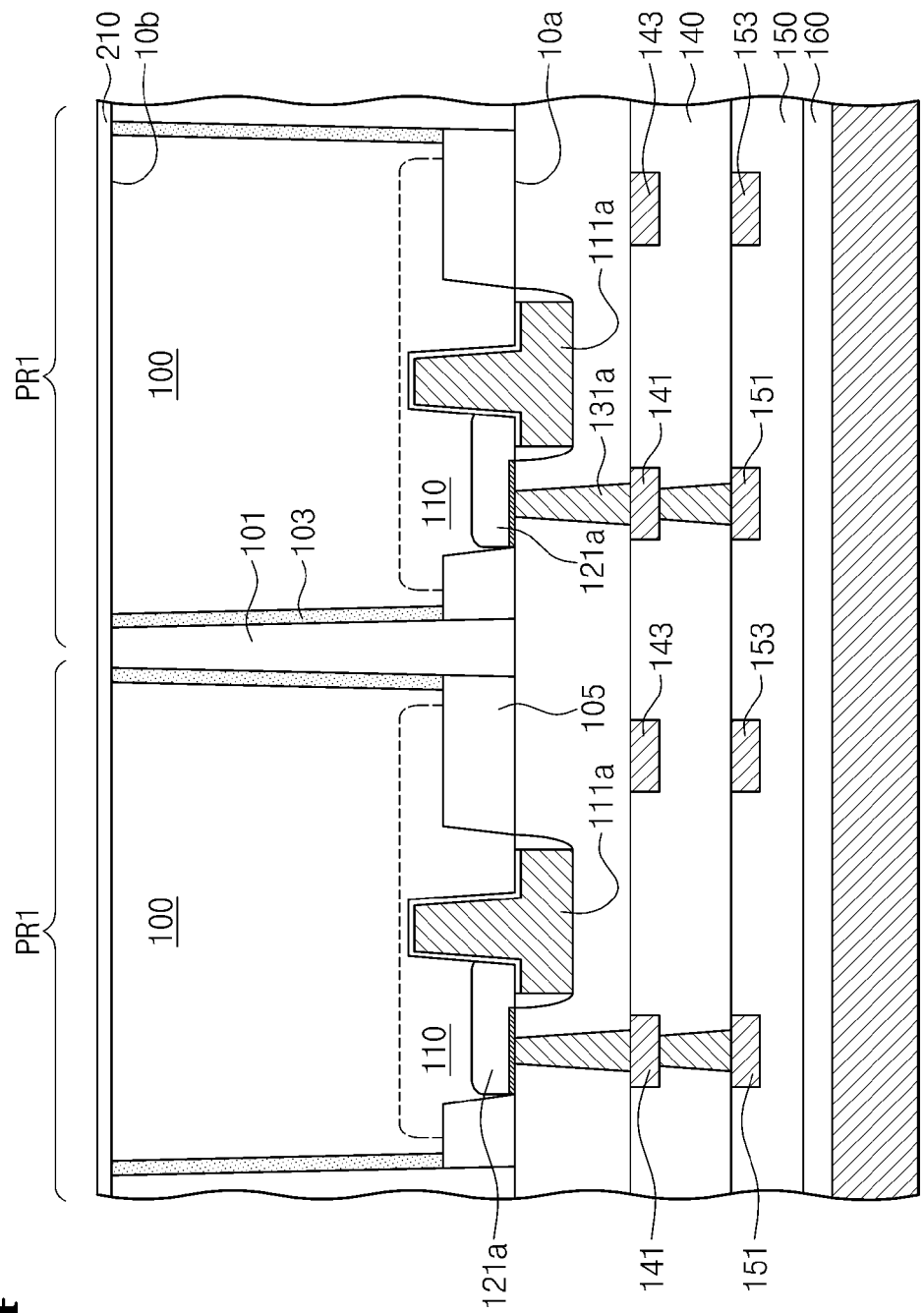

Referring to FIG. 24, the semiconductor substrate 1 may be removed to expose the second surface 10b of the epitaxial layer 100. For example, the removal of the semiconductor substrate 1 may include attaching a supporting substrate to the passivation layer 160, turning the epitaxial layer 100 over in such a way that the second surface 10b is oriented upward, and performing a planarization etching process on the semiconductor substrate 1. When the second surface 10b of the epitaxial layer 100 is exposed, the first device isolation layer 101 may also be exposed through the second surface 10b.

As a result of the planarization etching process, surface defects may occur on the second surface 10b of the epitaxial layer 100. To remove the surface defects, the protective planarization layer 210 may be formed on the second surface 10b of the epitaxial layer 100. In some exemplary embodiments, the protective planarization layer 210 may be an insulating layer containing p-type impurities. A thermal treatment process may be performed after the formation of the protective planarization layer 210, and in this case, the p-type impurities may be diffused from the protective planarization layer 210 to the second surface 10b of the epitaxial layer 100.

Thereafter, as shown in FIGS. 4A and 4B, the color filter layer 220 and the micro lens 230 may be formed on the protective planarization layer 210 of each of the first and second pixel regions PR1 and PR2.

According to the method of fabricating a CMOS image sensor described above, the epitaxial layer 100, which is used to generate photocharges from an incident light, is formed before defining the first and second pixel regions PR1 and PR2 or forming the first device isolation layer 101. Accordingly, it is possible to omit an ion implantation process for forming a photo diode and thereby reduce fabrication cost for a CMOS image sensor. In addition, it is possible to decrease a difference in electric potential between center and edge portions of each pixel region and thereby increase an area for generating and accumulating photocharges.

Figure 25:
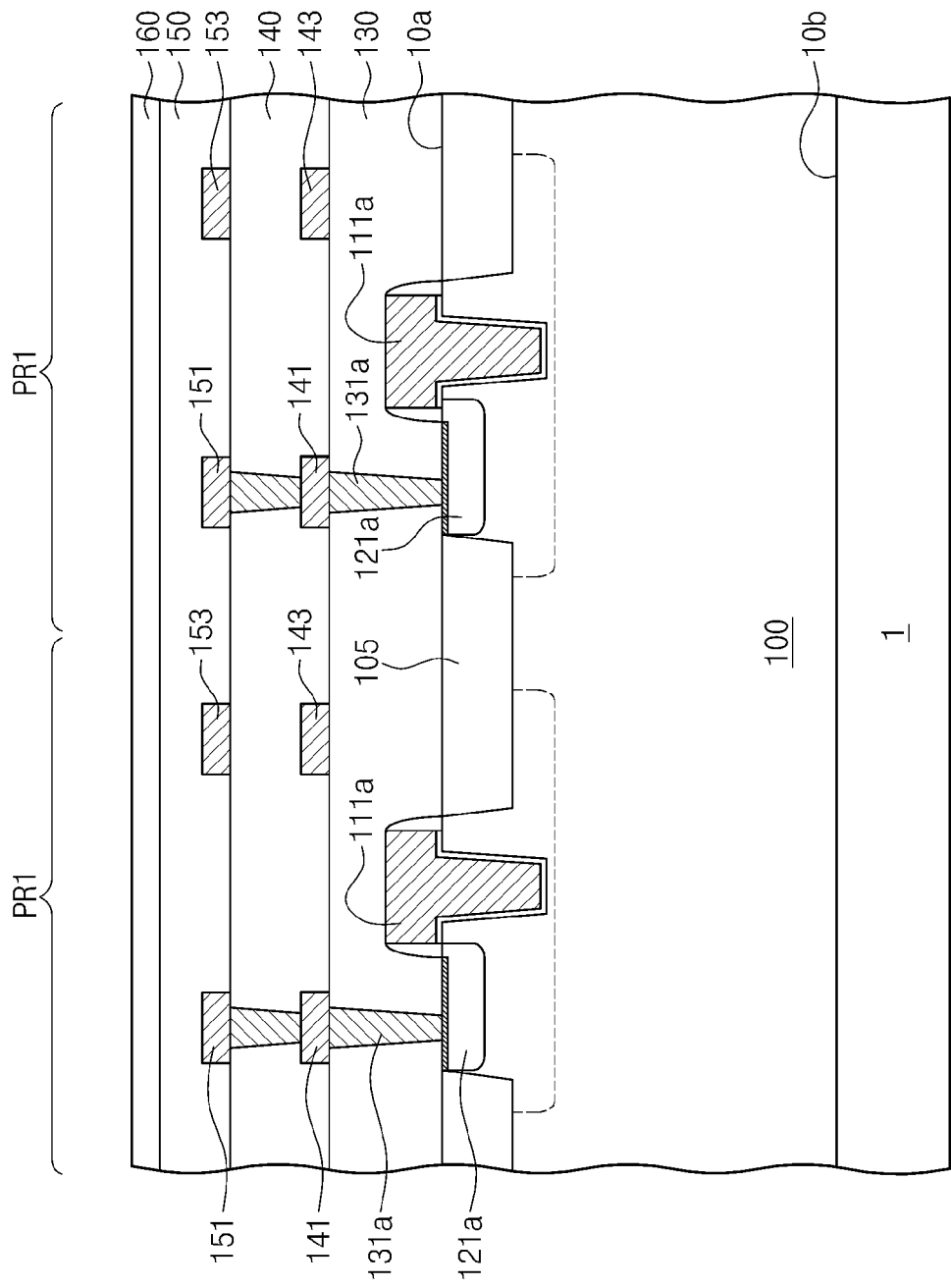
FIGS. 25 through 27 are sectional views illustrating a method of fabricating a CMOS image sensor according to other exemplary embodiments of the inventive concept.
Figure 26:
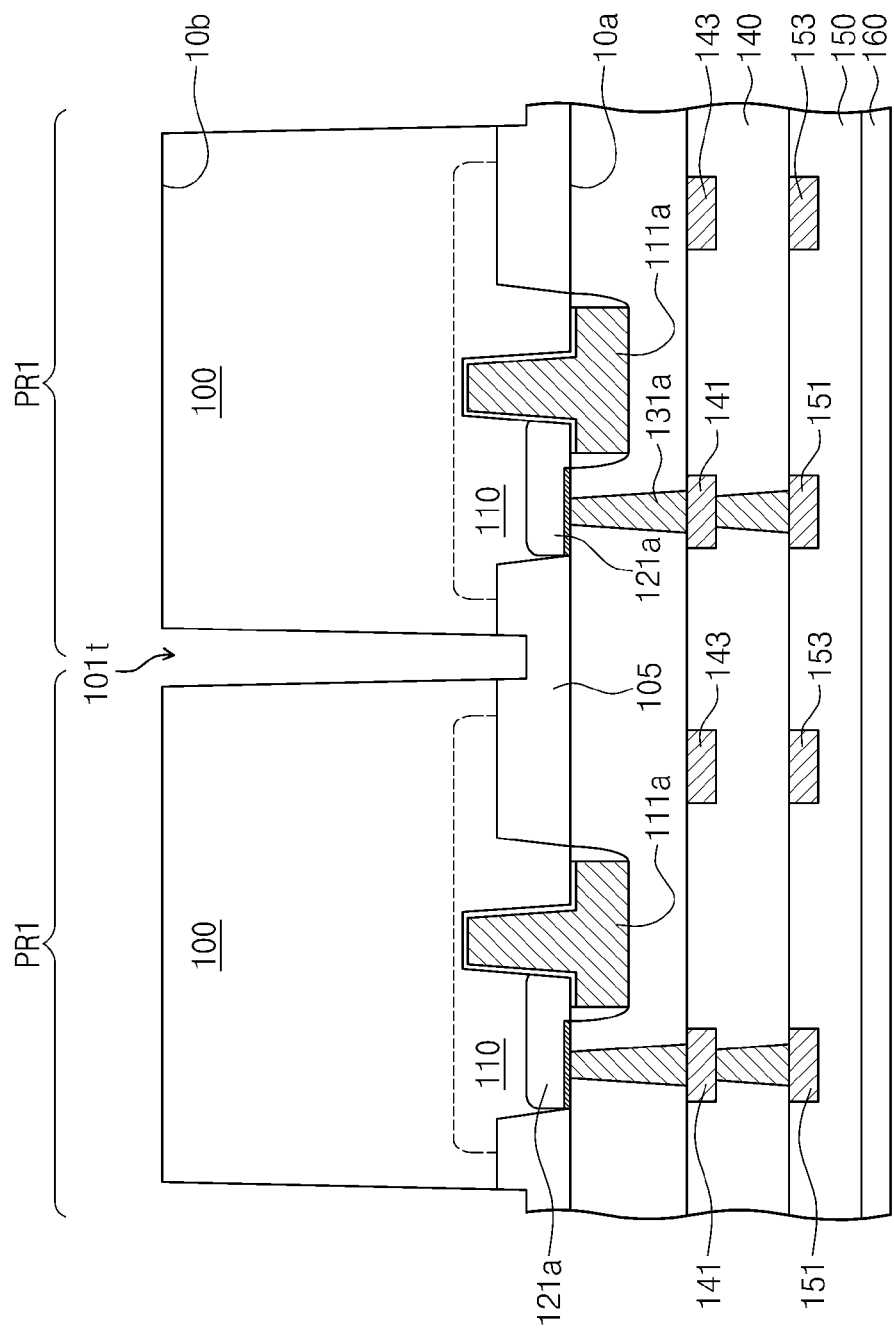
Figure 27:
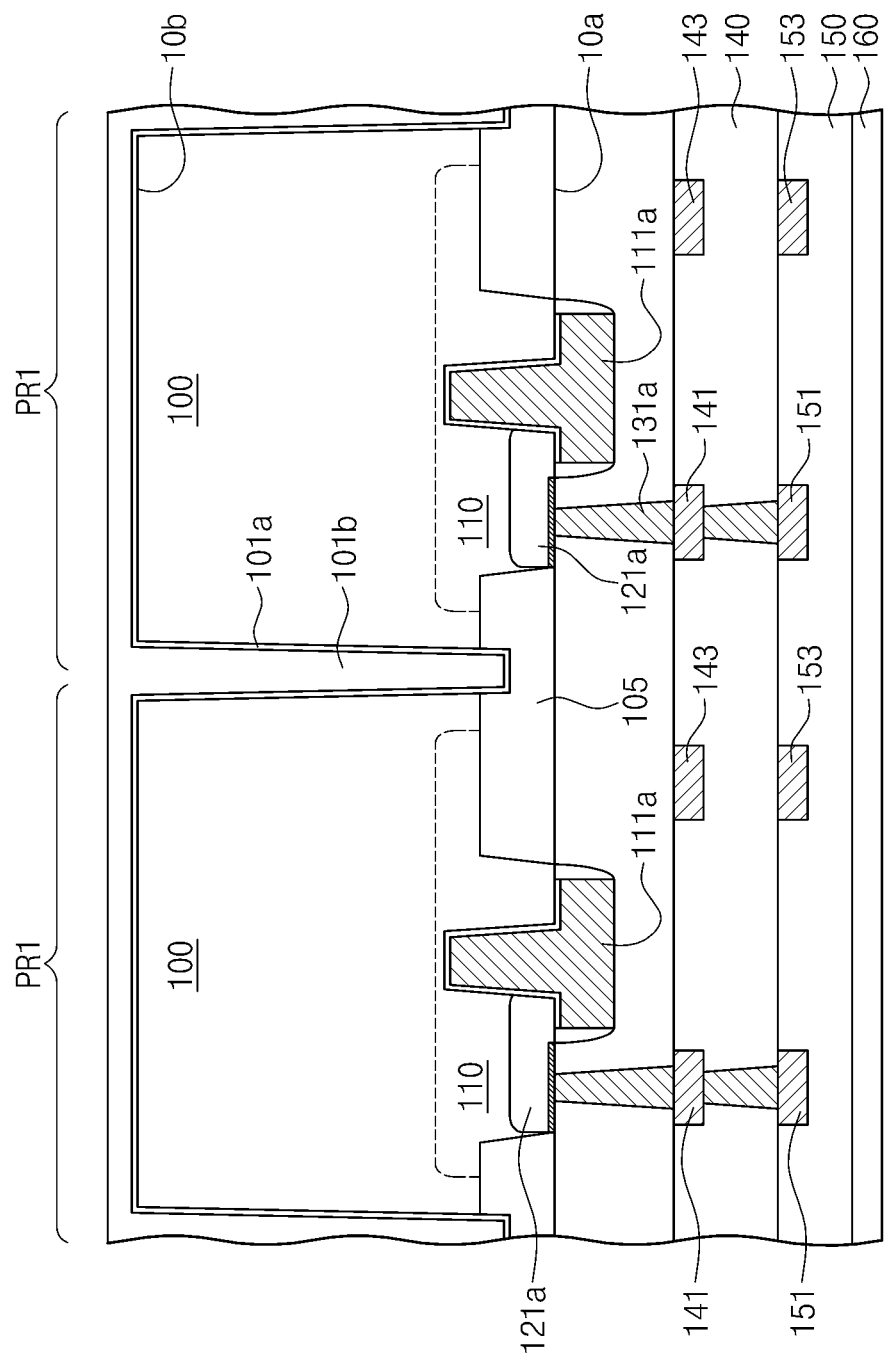

FIGS. 25 through 27 are sectional views illustrating a method of fabricating a CMOS image sensor according to other exemplary embodiments of the inventive concept.

Referring to FIG. 25, the epitaxial layer 100 having the first conductivity type may be formed on the semiconductor substrate 1. The epitaxial layer 100 may have the first and second surfaces 10a and 10b facing each other. Here, the second surface 10b of the epitaxial layer 100 may be in contact with the semiconductor substrate 1.

After the formation of the epitaxial layer 100, the well impurity layer 110 may be formed adjacent to the first surface 10a of the epitaxial layer 100. The well impurity layer 110 may be formed by injecting impurities into the epitaxial layer 100 and may have the second conductivity type (e.g., p-type).

According to this exemplary embodiment, the second device isolation layer 105 defining the first and second active portions (e.g., ACT1 and ACT2 of FIG. 3) may be formed in advance before the formation of the first device isolation layer 101. Here, the formation of the second device isolation layer 105 may include patterning the epitaxial layer 100 to form a shallow trench, and then, forming an insulating material to fill the shallow trench. The shallow trench may be formed adjacent to the first surface 10a to define the first and second active portions (e.g., ACT1 and ACT2 of FIG. 3). The second device isolation layer 105 may be formed in such a way that the bottom surface thereof is positioned spaced apart from the first and second surfaces 10a and 10b of the epitaxial layer 100 or in the well impurity layer 110.

After the formation of the second device isolation layer 105, the charge transfer transistors and the logic transistors may be formed on the first surface 10a of the epitaxial layer 100. In some exemplary embodiments, as shown in FIG. 3, the first transfer gate 111a and the first floating diffusion region 121a may be formed on and in the first active portion ACT1 of the first pixel region PR1, and the second transfer gate 111b and the second floating diffusion region 121b may be formed on and in the first active portion ACT1 of the second pixel region PR2. The logic transistors may be formed on the second active portions ACT2 of the first and second pixel regions PR1 and PR2.

Thereafter, the interlayered insulating layers 130, 140, and 150 may be formed on the first surface 10a of the epitaxial layer 100 to cover the charge transfer transistors and the logic transistors. The contact plugs 131a, 131b, 133a, 133b, 135a, 135b, and 135g and the interconnection lines 141, 143, 151, and 153 may be formed in or between the interlayered insulating layers 130, 140, and 150.

Referring to FIG. 26, the supporting substrate may be attached to the passivation layer 160, and the planarization etching process may be performed to remove the semiconductor substrate 1. As a result, the second surface 10b of the epitaxial layer 100 may be exposed.

Next, the second surface 10b of the epitaxial layer 100 may be patterned to form the deep trench 101t defining the first and second pixel regions PR1 and PR2. According to this exemplary embodiment, the formation of the deep trench 101t may include forming a mask pattern (not shown) on the second surface 10b of the epitaxial layer 100 and then anisotropically etching the epitaxial layer 100 using the mask pattern as an etch mask. The deep trench 101t may be formed to extend from the second surface 10b of the epitaxial layer 100 into the second device isolation layer 105 and expose a portion of the second device isolation layer 105. Further, the epitaxial layer 100 may be exposed by the sidewall of the deep trench 101t.

Even in the case where the deep trench 101t is formed using the anisotropic etching process, the deep trench 101t may be formed to have a width gradually decreasing in a direction from the second surface 10b of the epitaxial layer 100 to the first surface 10a, as shown.

Referring to FIG. 27, the first device isolation layer 101 may be formed by filling the deep trench 101t with an insulating layer. The first device isolation layer 101 may be formed to be in direct contact with the epitaxial layer 100 through the side surface of the deep trench 101t.

In some exemplary embodiments, the first device isolation layer 101 may include the liner insulating layer 101a and the insulating gapfill layer 101b. Here, the liner insulating layer 101a may be formed to conformally cover the second surface 10b of the epitaxial layer 100 and an inner surface of the deep trench 101t. The insulating gapfill layer 101b may be formed to fill the deep trench 101t provided with the liner insulating layer 101a. In certain exemplary embodiments, as shown in FIG. 13, the air gap 101c may be formed in the deep trench 101t. In other exemplary embodiments, the first device isolation layer 101 may include a silicon oxide layer and a poly-silicon layer, which are sequentially formed in the deep trench 101t, as shown in FIG. 12.

Thereafter, the color filter layer and the micro lenses may be formed on the insulating gapfill layer 101b. Before the formation of the color filter layer, a planarization process may be performed on the insulating gapfill layer.

FIGS. 28 through 31 are sectional views illustrating a method of fabricating a CMOS image sensor according to still other exemplary embodiments of the inventive concept.

In this exemplary embodiment, an impurity region 1n having the first conductivity type may be formed in the semiconductor substrate 1. The impurity region 1n may be used as a part of the photoelectric conversion device. The impurity region 1n may be formed to occupy an area of each of the first and second pixel regions PR1 and PR2, when viewed in a plan view. In some exemplary embodiments, the impurity region 1n may be formed to occupy the whole area of each of the first and second pixel regions PR1 and PR2. Hereinafter, a method of forming the impurity region 1n will be described in more detail with reference to FIGS. 28 through 31.

Figure 28:
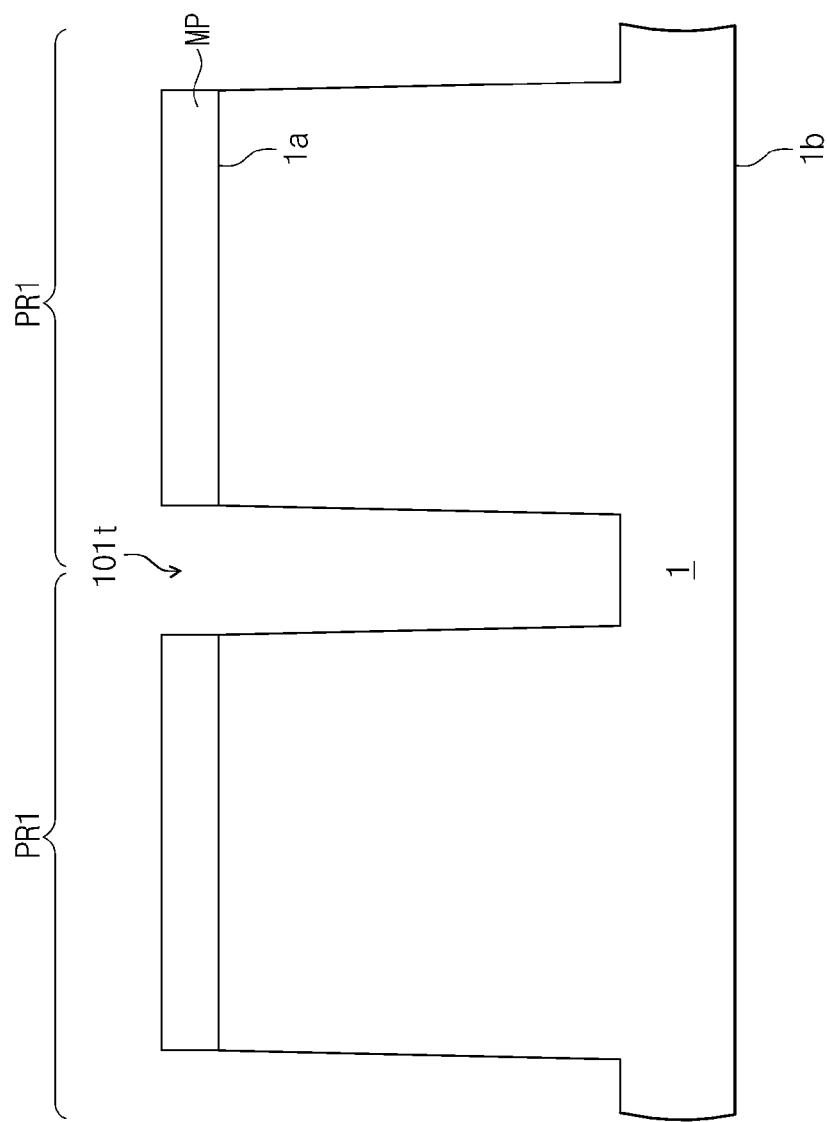
FIGS. 28 through 31 are sectional views illustrating a method of fabricating a CMOS image sensor according to still other exemplary embodiments of the inventive concept.

Referring to FIG. 28, the deep trench 101t may be formed in the semiconductor substrate 1 having a first surface 1a and a second surface 1b facing each other. The semiconductor substrate may be, for example, a doped semiconductor wafer (e.g., of n- or p-type).

The deep trench 101t may be formed by etching the first surface 1a of the semiconductor substrate 1. The deep trench 101t may define the pixel regions PR1 and PR2. In detail, the formation of the deep trench 101t may include a mask pattern MP on the first surface 1a of the semiconductor substrate 1 and anisotropically etching the semiconductor substrate 1 using the mask pattern MP as an etch mask.

Figure 29:
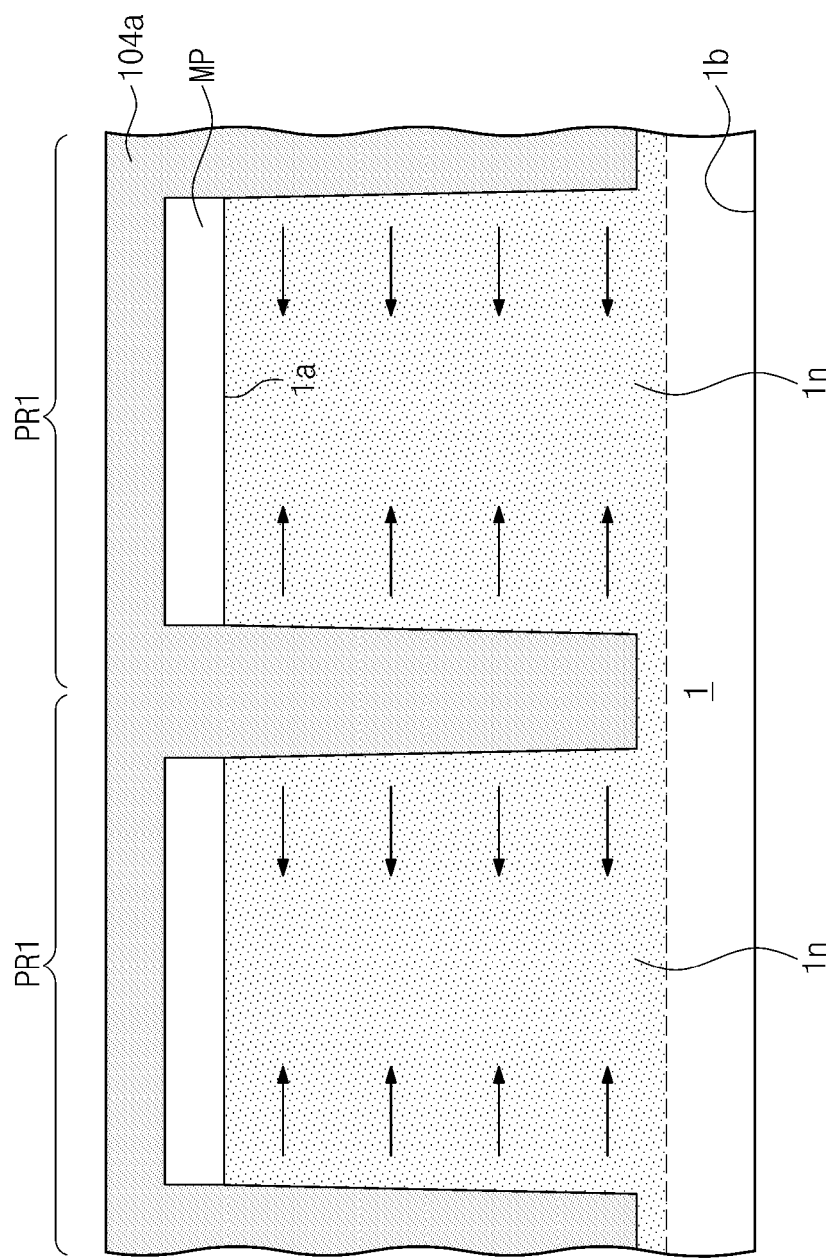

Referring to FIG. 29, a first sacrificial layer 104a may be formed on the semiconductor substrate 1 with the deep trench 101t. The first sacrificial layer 104a may contain impurities of the first conductivity type (e.g., n-type) and may be formed to fill the deep trench 101t. A thermal treatment process may be performed after the formation of the first sacrificial layer 104a. During the thermal treatment process, the impurities in the first sacrificial layer 104a may be diffused into the semiconductor substrate 1. For example, the thermal treatment process may be performed to diffuse from the first sacrificial layer 104a into center portions of the pixel regions PR1 and PR2 through the edge portions of the pixel regions PR1 and PR2. In certain exemplary embodiments, the diffusion of the impurities may be performed to form the impurity region 1n in an area of each of the pixel regions PR1 and PR2. In some exemplary embodiments, the diffusion of the impurities may be performed to form the impurity region 1n in the whole area of each of the pixel regions PR1 and PR2. After the impurity region 1n is formed in each of the pixel regions PR1 and PR2, the first sacrificial layer 104a may be removed to expose the deep trench 101t.

Figure 30:
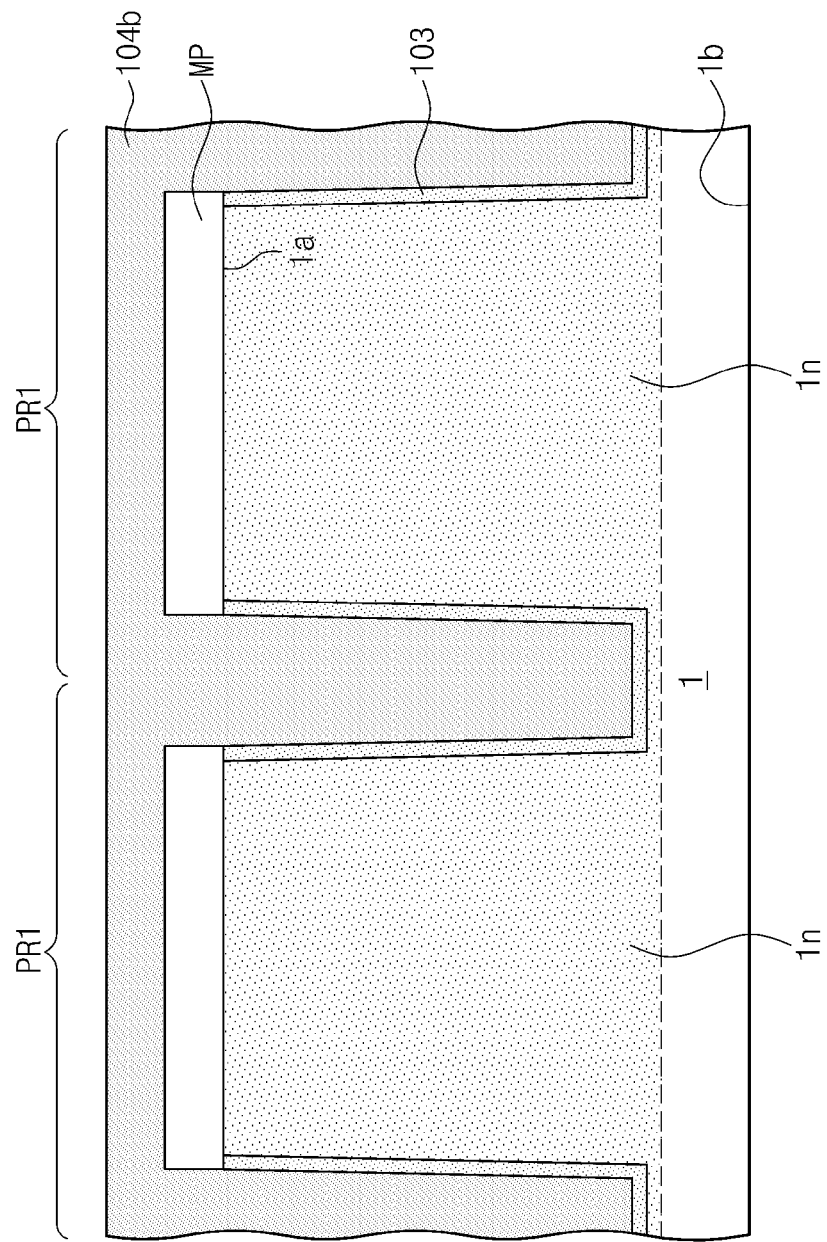

Referring to FIG. 30, after the formation of the impurity region 1n, a second sacrificial layer 104b may be formed in the deep trench 101t. The second sacrificial layer 104b may be formed to contain impurities of the second conductivity type (e.g., p-type). Next, the potential barrier layer 103 may be formed to conformally cover the surface of the deep trench 101t. The potential barrier layer 103 may be formed by performing a thermal treatment process on the resulting structure with the second sacrificial layer 104b. The second sacrificial layer 104b and the mask pattern MP may be removed after the formation of the potential barrier layer 103.

Figure 31:
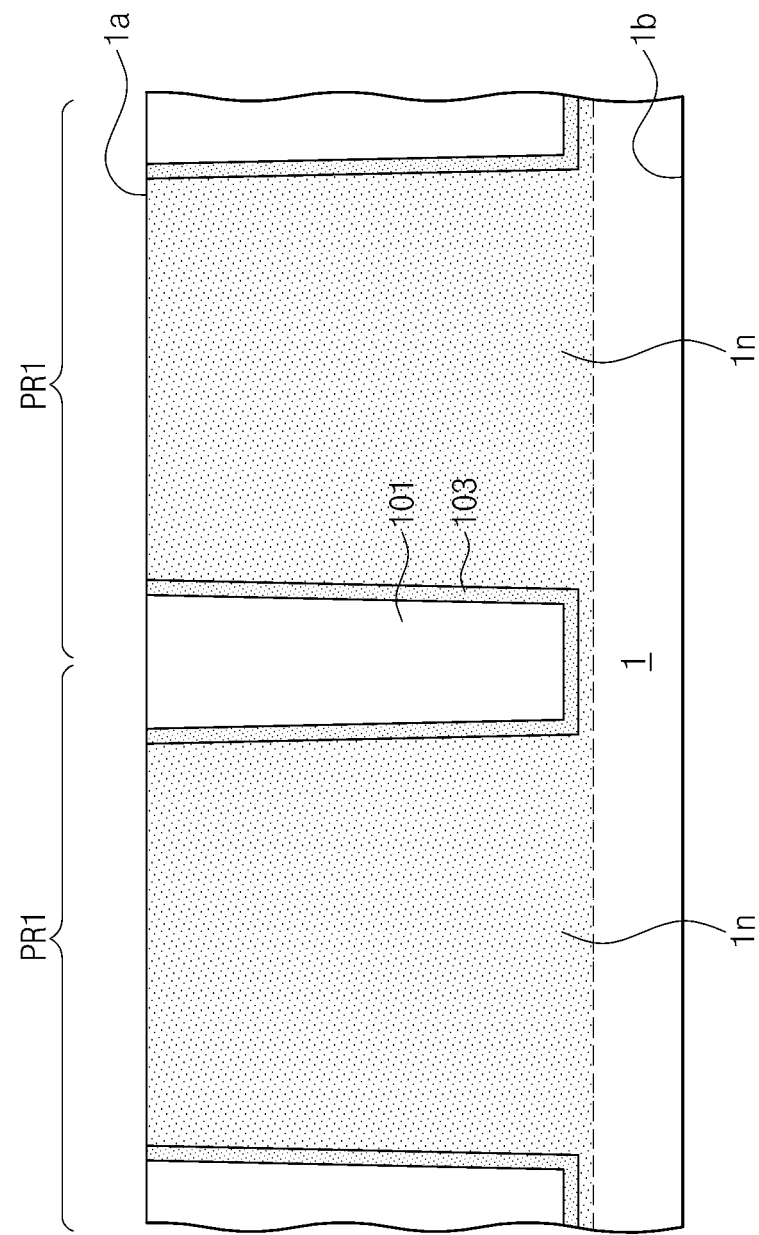

Referring to FIG. 31, the first device isolation layer 101 may be formed in the deep trench 101t, after the formation of the potential barrier layer 103. The formation of the first device isolation layer 101 may include forming an insulating layer to fill the deep trench 101t and planarizing the insulating layer to expose the first surface 1a of the semiconductor substrate 1.

Thereafter, as described with reference to FIG. 20, the well impurity layer having the second conductivity type may be formed in the impurity region 1n of each of the pixel regions PR1 and PR2. The subsequent processes for fabricating the CMOS image sensor may be performed in the same or similar manner as those of the previous embodiments described with reference to FIGS. 21 through 24 or FIGS. 25 through 27, and thus a repeated description is omitted here.

Figure 32:
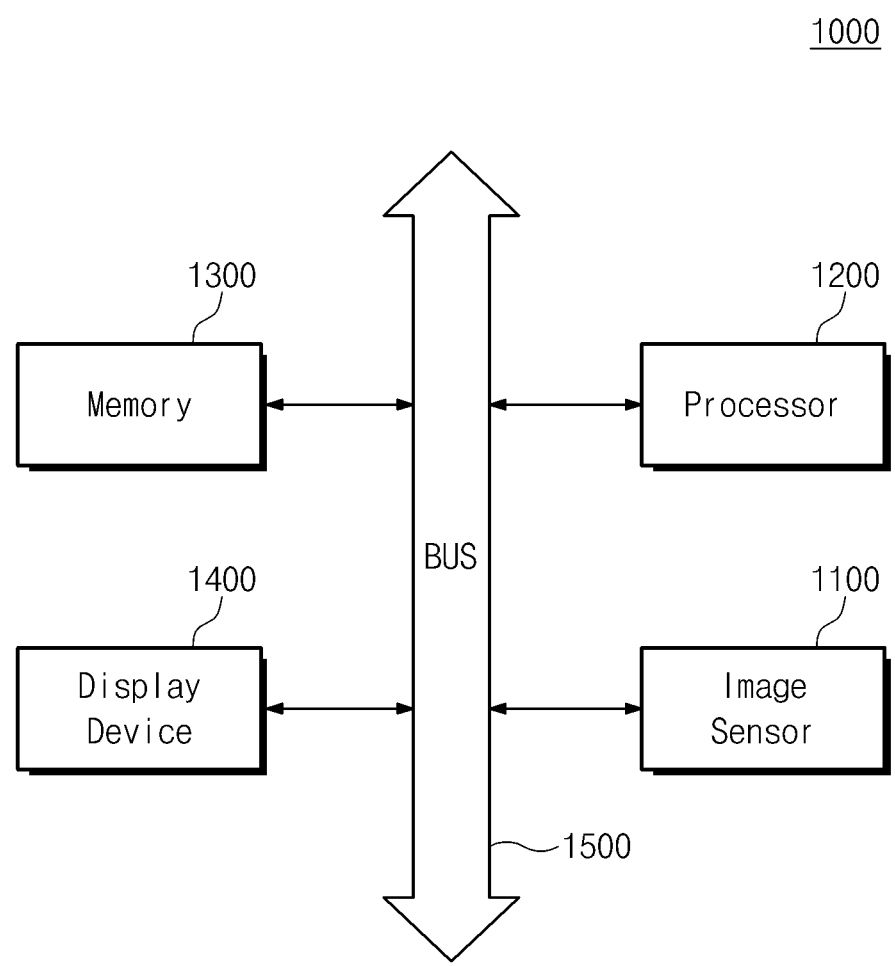
FIG. 32 is a schematic block diagram illustrating an example of an electronic device including a CMOS image sensor according to exemplary embodiments of the inventive concept.

FIG. 32 is a schematic block diagram illustrating an example of processor-based systems including a CMOS image sensor according to exemplary embodiments of the inventive concept.

Referring to FIG. 32, a processor-based system 1000 may include an image sensor 1100, a processor 1200, a memory 1300, a display device 1400, and a bus 1500. The image sensor 1100 may capture external images in response to control signals of the processor 1200. The processor 1200 may store the captured image information in the memory 1300 through the bus 1500. The processor 1200 may output the image stored in the memory 1300 to display the image on the display device 1400.

The system 1000 may include computer systems, camera systems, scanners, machined watch systems, navigation systems, videophones, monitoring systems, automatic focus systems, tracking systems, motion monitoring systems, and image stabilization systems, but are not limited thereto. Further, in the case where the processor-based system 1000 is applied for mobile devices, a battery may be further provided to supply an operation power to the mobile devices.

Figure 33:
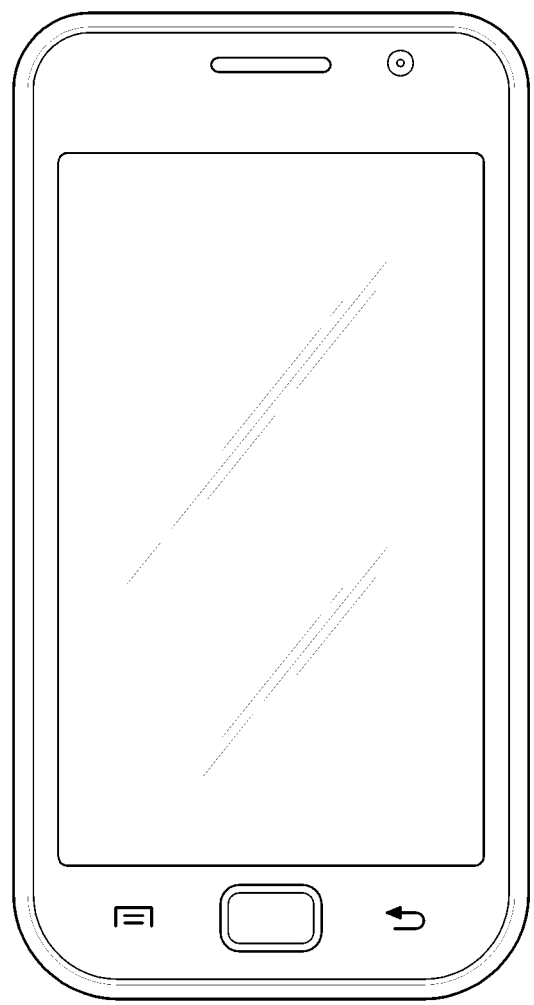
FIGS. 33 and 34 are schematic diagrams illustrating some examples of electronic devices including a CMOS image sensor according to exemplary embodiments of the inventive concept.
Figure 34:
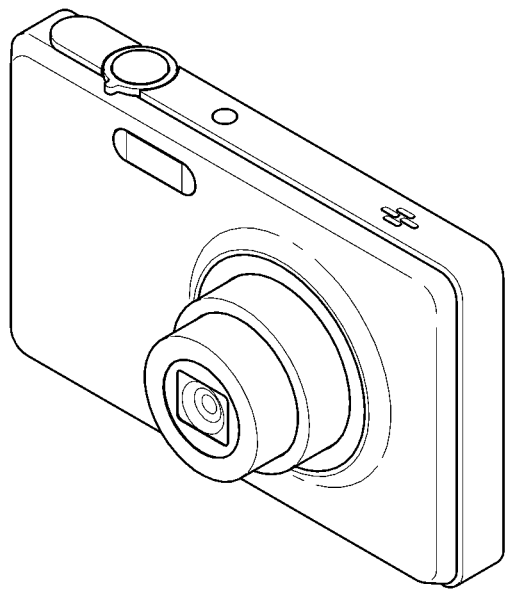

FIGS. 33 and 34 are schematic diagrams illustrating some examples of electronic devices including a CMOS image sensor according to exemplary embodiments of the inventive concept.

A CMOS image sensor according to exemplary embodiments of the inventive concept can be applied in a variety of electronic devices with an imaging function. For example, the CMOS image sensor according to exemplary embodiments of the inventive concept may be applied in a mobile phone or smart phone 2000 as shown in FIG. 33 or for a digital camera 3000 or a digital camcorder as shown in FIG. 34.

Alternatively, the CMOS image sensor may be applied in a personal digital assistant (PDA), a portable multimedia player (PMP), a digital multimedia broadcast (DMB) device, a global positioning system (GPS), a handheld gaming console, a portable computer, a web tablet, a wireless phone, a digital music player, a memory card, or other electronic products, which may be configured to receive or transmit information data wirelessly.

According to exemplary embodiments of the inventive concept, a photoelectric conversion device (e.g., a photo diode) is realized using a doped epitaxial layer (e.g., of a first conductivity type) rather than an ion implantation process. In other words, the epitaxial layer may include pixel regions defined by a first device isolation layer, and an increased area of each pixel region can be used to generate photocharges from incident light as compared to a case in which ion implantation is used. In some exemplary embodiments, the whole area of each pixel region can be used to generate photocharges from incident light. The increase of a photocharge-generating area makes it possible to improve a full well capacity property of a CMOS image sensor. Thus, by using the CMOS image sensor according to exemplary embodiments of the inventive concept, it is possible to acquire more clear images.

In addition, since an ion implantation process for forming the photoelectric conversion device (e.g., a photo diode) can be omitted, it is possible to simplify a fabrication process of the CMOS image sensor and reduce a fabrication cost thereof.

Further, since the pixel regions are defined by a device isolation layer penetrating the epitaxial layer, it is possible to prevent a cross talk from occurring between the pixel regions.

Furthermore, a well impurity layer of a second conductivity type is formed in the epitaxial layer of the first conductivity type, and logic transistors are formed on the well impurity layer. Here, since the logic transistors can be overlapped with the photoelectric conversion device in a plan view, it is possible to fabricate a CMOS image sensor with an increased integration density.

While exemplary embodiments of the inventive concepts have been particularly shown and described, it will be understood by one of ordinary skill in the art that variations in form and detail may be made therein without departing from the spirit and scope of the attached claims.

What is claimed is:

1. A complementary metal-oxide-semiconductor (CMOS) image sensor, comprising
   an epitaxial layer having a first conductivity type and having a first surface and a second surface facing each other;
   a first device isolation layer extending from the first surface to the second surface of the epitaxial layer to define a first pixel region and a second pixel region;
   a well impurity layer of a second conductivity type formed adjacent to the first surface and formed in the epitaxial layer of each of the first and second pixel regions;
   a second device isolation layer formed in the well impurity layer in each of the first and second pixel regions to define a first active portion and a second active portion which are spaced apart from each other in each of the first and second pixel regions;
   first and second transfer gates disposed on the first active portions of the first and second pixel regions, respectively;
   first and second floating diffusion regions formed in the first active portions and beside the first and second transfer gates, respectively; and
   a connection line crossing over the first and second pixel regions and being connected to both the first and second floating diffusion regions.

2. The CMOS image sensor of claim 1, wherein, in the epitaxial layer, a doping concentration of impurities of the first conductivity type decreases in a direction from the first surface toward the second surface.

3. The CMOS image sensor of claim 1, wherein the epitaxial layer comprises a first epitaxial layer having a first doping concentration, a second epitaxial layer having a second doping concentration different from the first doping concentration, and a third epitaxial layer having a third doping concentration different from the second doping concentration.

4. The CMOS image sensor of claim 3, wherein the first epitaxial layer is adjacent to the second surface, the third epitaxial layer is adjacent to the first surface, and the second epitaxial layer is disposed between the first and third epitaxial layers, and
   wherein the first doping concentration is lower than the second doping concentration, and the second doping concentration is lower than the third doping concentration.

5. The CMOS image sensor of claim 1, further comprising a potential barrier layer having the second conductivity type and enclosing a sidewall of the first device isolation layer, wherein a doping concentration of impurities of the second conductivity type is higher in the potential barrier layer than in the well impurity layer.

6. The CMOS image sensor of claim 1, wherein the first device isolation layer comprises an insulating layer extending from the first surface to the second surface of the epitaxial layer, and wherein the epitaxial layer is in direct contact with the insulating layer.

7. The CMOS image sensor of claim 1, wherein a width of the first device isolation layer decreases in a direction from the first surface toward the second surface.

8. The CMOS image sensor of claim 1, wherein a width of the first device isolation layer increases in a direction from the first surface toward the second surface.

9. The CMOS image sensor of claim 1, wherein the first device isolation layer comprises an insulating layer extending from a bottom surface of the second device isolation layer to the second surface of the epitaxial layer, the insulating layer having an air gap formed therein.

10. The CMOS image sensor of claim 1, wherein the first device isolation layer comprises:
a first insulating layer being in contact with the epitaxial layer and having a refractive index lower than that of the epitaxial layer; and
a second insulating layer having a refractive index different from that of the first insulating layer.

11. The CMOS image sensor of claim 1, further comprising:
a first logic transistor formed on the second active portion of the first pixel region; and
a second logic transistor formed on the second active portion of the second pixel region,
wherein the connection line is electrically connected to a drain electrode of the first logic transistor and a gate electrode of the second logic transistor.

12. The CMOS image sensor of claim 11, further comprising a third logic transistor formed on the second active portion of the second pixel region, wherein the third logic transistor is connected in series to the second logic transistor.

13. A complementary metal-oxide-semiconductor (CMOS) image sensor, comprising:
an epitaxial layer having a first conductivity;
a first device isolation layer formed in the epitaxial layer and isolating a first pixel region from a second pixel region;
a well impurity layer formed in the epitaxial layer of each of the first and second pixel regions, the well impurity layer having a second conductivity;
a second device isolation layer formed in the well impurity layer in each of the first and second pixel regions to isolate, in each of the first and second pixel regions, a first active portion from a second active portion,
wherein transfer gates are disposed on the first active portions and floating diffusion regions are formed in the active portions to generate and collect photocharges in the first and second pixel regions.

14. The CMOS image sensor of claim 13, wherein an area of the first pixel region and an area of the second pixel region of the epitaxial layer available to generate the photocharges are larger than areas used to generate photocharges in a CMOS sensor formed using ion implantation.

15. The CMOS image sensor of claim 13, wherein substantially a whole area of the first pixel region and substantially a whole area of the second pixel region are used to generate the photocharges.

16. The CMOS image sensor of claim 13, wherein the epitaxial layer comprises a first epitaxial layer having a first doping concentration, a second epitaxial layer having a second doping concentration different from the first doping concentration, and a third epitaxial layer having a third doping concentration different from the second doping concentration.

17. The CMOS image sensor of claim 16, wherein the first doping concentration is lower than the second doping concentration, and the second doping concentration is lower than the third doping concentration, and
wherein the third epitaxial layer is adjacent to the well impurity layer.

18. The CMOS image sensor of claim 13, further comprising a potential barrier layer having the second conductivity and enclosing a sidewall of the first device isolation layer,
wherein a doping concentration of impurities of the second conductivity is higher in the potential barrier layer than in the well impurity layer.

19. The CMOS image sensor of claim 13, wherein the first device isolation layer comprises an insulating layer, and the epitaxial layer is in direct contact with the insulating layer.

20. The CMOS image sensor of claim 13, wherein a width of the first device isolation layer is non-uniform within the epitaxial layer.

* * * * *